(12) United States Patent
Hwang et al.

(10) Patent No.: US 10,867,890 B2
(45) Date of Patent: Dec. 15, 2020

(54) MUTLI-CHIP PACKAGE WITH ENCAPSULATED CONDUCTOR VIA

(71) Applicant: Taiwan Semiconductor Manufacturing Co., Ltd., Hsinchu (TW)

(72) Inventors: Chien-Ling Hwang, Hsinchu (TW); Ching-Hua Hsieh, Hsinchu (TW); Hsin-Hung Liao, Taipei (TW); Sung-Yueh Wu, Chiayi County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/292,344

(22) Filed: Mar. 5, 2019

(65) Prior Publication Data
US 2020/0105689 A1  Apr. 2, 2020

Related U.S. Application Data
(60) Provisional application No. 62/737,110, filed on Sep. 27, 2018.

(51) Int. Cl.
*H01L 23/12* (2006.01)
*H01L 23/48* (2006.01)
(Continued)

(52) U.S. Cl.
CPC ............ *H01L 23/481* (2013.01); *H01L 21/56* (2013.01); *H01L 23/367* (2013.01); *H01L 23/49534* (2013.01); *H01L 23/49838* (2013.01); *H01L 23/5226* (2013.01); *H01L 23/552* (2013.01); *H01L 24/02* (2013.01); *H01L 24/13* (2013.01); *H01L 24/24* (2013.01); *H01L 24/25* (2013.01); *H01L 24/73* (2013.01); *H01L 24/82* (2013.01); *H01L 24/92* (2013.01);
(Continued)

(58) Field of Classification Search
CPC ....... H01L 24/02; H01L 21/56; H01L 23/367; H01L 23/552; H01L 24/13; H01L 24/24; H01L 24/25; H01L 24/73; H01L 24/82; H01L 24/92; H01L 21/76804; H01L 23/5226; H01L 23/481; H01L 25/0657; H01L 23/94534; H01L 23/49838
See application file for complete search history.

(56) References Cited

U.S. PATENT DOCUMENTS 8,993,380 B2   3/2015 Hou et al.
9,048,222 B2 * 6/2015 Hung ................. H01L 23/5384
(Continued)

*Primary Examiner* — Alonzo Chambliss
(74) *Attorney, Agent, or Firm* — JCIPRNET

(57) ABSTRACT

A semiconductor device and a manufacturing method thereof are provided. The semiconductor device includes a first semiconductor die, at least one first conductive connector disposed beside the first semiconductor die and electrically coupled to the first semiconductor die, an insulating encapsulation laterally encapsulating the first semiconductor die and the at least one first conductive connector, and a redistribution structure disposed on the insulating encapsulation and being in contact with the first semiconductor die and the at least one first conductive connector. A thickness of the at least one first conductive connector is less than a thickness of the insulating encapsulation.

20 Claims, 32 Drawing Sheets

(51) Int. Cl.
*H01L 23/28* (2006.01)
*H01L 21/00* (2006.01)
*H01L 21/4763* (2006.01)
*H01L 21/44* (2006.01)
*H01L 23/00* (2006.01)
*H01L 23/552* (2006.01)
*H01L 23/367* (2006.01)
*H01L 21/56* (2006.01)
*H01L 23/498* (2006.01)
*H01L 23/495* (2006.01)
*H01L 23/522* (2006.01)

(52) U.S. Cl.
CPC ............... *H01L 2224/02331* (2013.01); *H01L 2224/02379* (2013.01); *H01L 2224/02381* (2013.01); *H01L 2224/13024* (2013.01); *H01L 2224/24011* (2013.01); *H01L 2224/24105* (2013.01); *H01L 2224/24146* (2013.01); *H01L 2224/25171* (2013.01); *H01L 2224/73267* (2013.01); *H01L 2224/821* (2013.01); *H01L 2224/92244* (2013.01); *H01L 2924/18162* (2013.01); *H01L 2924/19041* (2013.01); *H01L 2924/19042* (2013.01); *H01L 2924/19101* (2013.01)

(56) References Cited

U.S. PATENT DOCUMENTS

| | | | |
|---|---|---|---|
| 9,226,382 B2 * | 12/2015 | Inui | H05K 1/186 |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,633,895 B2 * | 4/2017 | Tsai | H01L 21/563 |
| 9,666,502 B2 | 5/2017 | Chen et al. | |
| 9,704,825 B2 * | 7/2017 | Wu | H01L 21/561 |
| 9,735,131 B2 | 8/2017 | Su et al. | |
| 10,163,802 B2 * | 12/2018 | Lin | H01L 23/5286 |
| 10,461,034 B2 * | 10/2019 | Wu | H01L 21/565 |
| 2013/0105991 A1 * | 5/2013 | Gan | H01L 25/105 257/777 |
| 2013/0168681 A1 * | 7/2013 | Suzuki | H01L 29/7869 257/59 |
| 2013/0241080 A1 * | 9/2013 | Pagaila | H01L 24/11 257/774 |
| 2014/0203443 A1 * | 7/2014 | Pagaila | H01L 25/16 257/773 |
| 2016/0133562 A1 * | 5/2016 | Lee | H01L 23/49822 257/774 |
| 2019/0103387 A1 * | 4/2019 | Tsou | H01L 21/486 |
| 2020/0020640 A1 * | 1/2020 | Wu | H01L 21/561 |

* cited by examiner

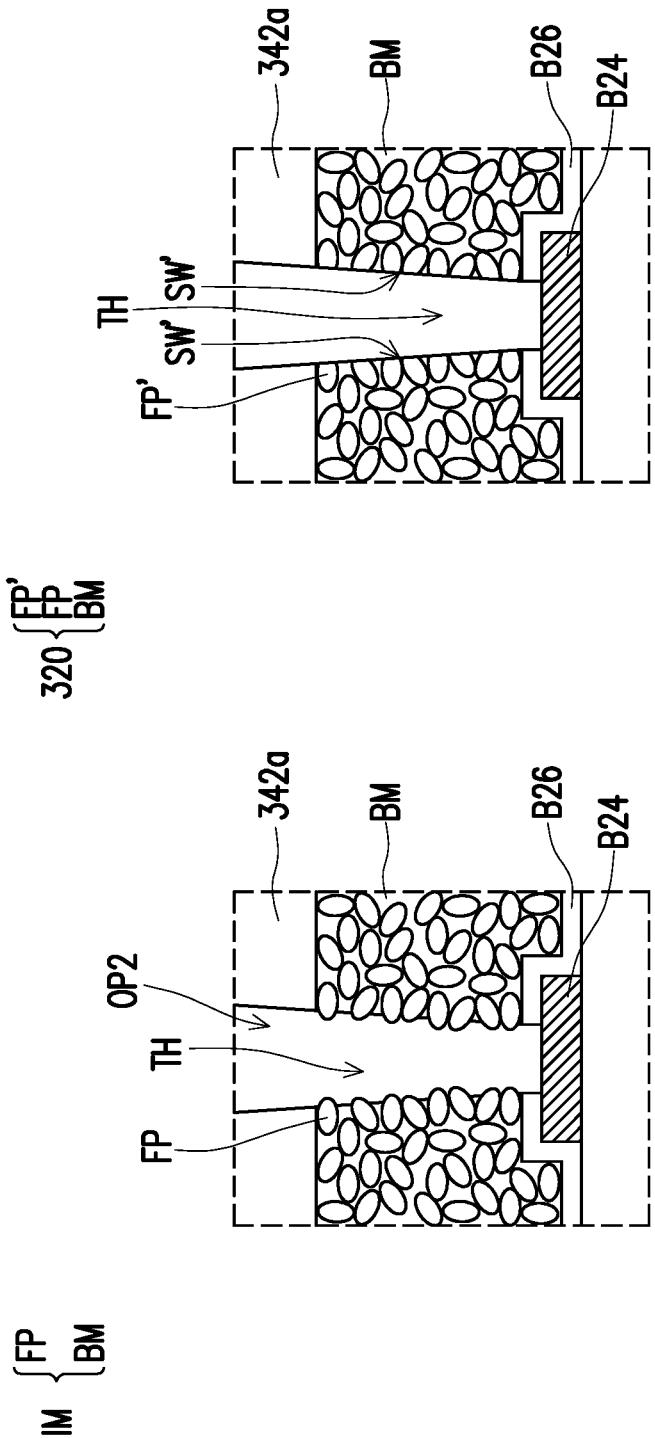

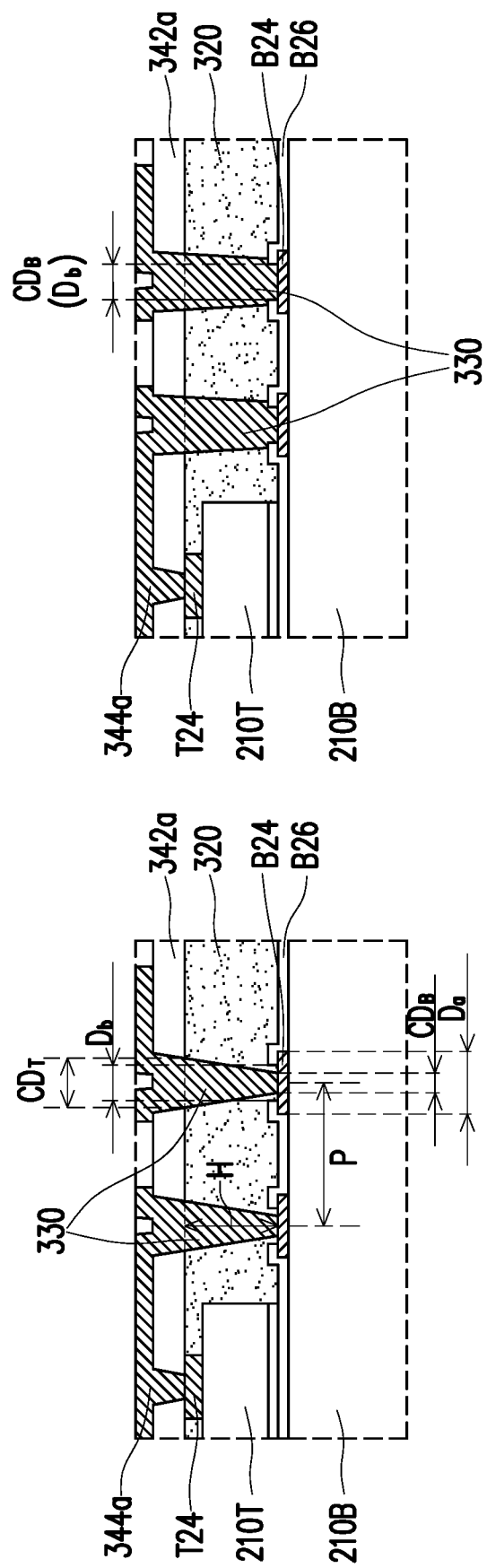

MUTLI-CHIP PACKAGE WITH ENCAPSULATED CONDUCTOR VIA

CROSS-REFERENCE TO RELATED APPLICATION

This application claims the priority benefit of U.S. provisional application Ser. No. 62/737,110, filed on Sep. 27, 2018. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic devices. As the demand for shrinking electronic devices has grown, a need for smaller and more creative packaging techniques of semiconductor dies has emerged. Thus, packages such as wafer level packaging (WLP) have begun to be developed, in which integrated circuits (ICs) are placed on a carrier having connectors for making connection to the ICs and other electrical components. In an attempt to further increase circuit density, three-dimensional (3D) ICs have also been developed, in which multiple ICs are bonded together electrical connections are formed between the dies and conductive pads on a substrate. As the demand for miniaturization, higher speed and greater bandwidth, as well as lower power consumption and latency has grown recently, there has grown a need for smaller and more creative packaging techniques of semiconductor devices.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12A and FIG. 12B are schematic enlarged cross-sectional views illustrating a surface planarization process of the dashed region A depicted in FIG. 110B in accordance with some exemplary embodiments of the disclosure.

FIG. 13 is a schematic enlarged cross-sectional view illustrating the dashed region B depicted in FIG. 11E in accordance with some exemplary embodiments of the disclosure.

FIG. 14 is another schematic enlarged cross-sectional view illustrating the dashed region B depicted in FIG. 11E in accordance with some exemplary embodiments of the disclosure.

DETAILED DESCRIPTION

Figure 1:
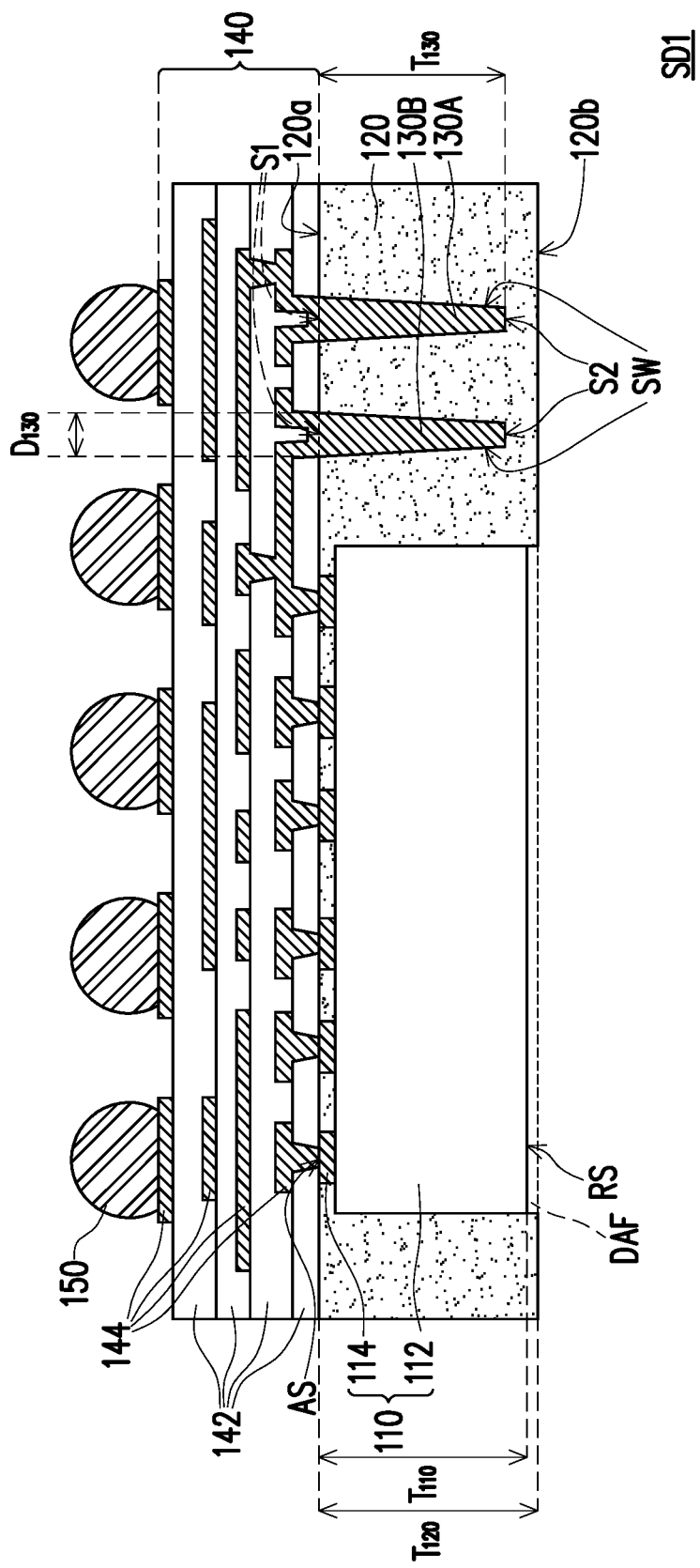
FIG. 1 to FIG. 4 are schematic cross-sectional views of a semiconductor device in accordance with various exemplary embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 4 are schematic cross-sectional views of a semiconductor device in accordance with various exemplary embodiments of the disclosure. Like elements in throughout the drawings are designated with the same reference numbers for ease of understanding. Referring to FIG. 1, a semiconductor device SD1 is provided. For example, the semiconductor device SD1 includes a semiconductor die 110, at least one conductive connector (e.g., 130A and 130B), an insulating encapsulation 120, a redistribution structure 140, and a plurality of conductive terminals 150. The conductive connectors 130A and 130B may be disposed beside the semiconductor die 110 and electrically coupled to the semiconductor die 110 through the redistribution structure 140. In some embodiments, the conductive connectors 130A and 130B are substantially identical, and may be disposed at the same side of the semiconductor die 110. The conductive connectors 130A and 130B may be spatially apart from each other by the insulating encapsulation 120. In some embodiments, one of the conductive connectors 130A and 130B includes an aspect ratio (e.g., a ratio of depth $T_{130}$ to diameter $D_{130}$) of about 16:3. The aspect ratio of one of the conductive connectors 130A and 130B may be up to about 35:6. Alternatively, the conductive connectors with higher/lower aspect ratios may be formed. The aspect ratios of the conductive connectors may vary with such as the device size, process technology, device application, etc. It should be noted that the conductive connectors 130A and 130B illustrated in FIG. 1 are provided for illustrative purposes, and the dimensions of the conductive connectors are not restricted in the disclosure. In addition, it should be appreciated that fewer or additional elements (e.g., semiconductor dies, conductive connectors, etc.) may be configured in the semiconductor device depending on the product requirements.

In some embodiments, the conductive connectors 130A and 130B may function as a capacitor structure for suppressing the signal noise sent from the semiconductor die 110. For example, multiple conductive connectors 130A arranged in a row and multiple conductive connectors 130B arranged in a row are disposed aside the semiconductor die 110, and the rows of the conductive connectors 130A and the conductive connectors 130B are interlaced with one another so as to be arranged in an array. The insulating encapsulation 120 may be disposed among the array of the conductive connectors 130A and 130B so as to form a metal-insulator-metal (MIM) capacitor structure. Alternatively, the conductive connectors 130A and 130B may be disposed at the opposite sides of the semiconductor die 110 to perform different functions in the semiconductor device as will be described later in other embodiments. The insulating encapsulation 120 may laterally encapsulate the semiconductor die 110 and the conductive connectors 130A and 130B. The redistribution structure 140 may be disposed on the insulating encapsulation 120, the semiconductor die 110, and the conductive connectors 130A and 130B. The conductive terminals 150 disposed on the redistribution structure 140 may be electrically coupled to the semiconductor die 110 and the conductive connectors 130A and 130B through the redistribution structure 140.

In some embodiments, a thickness (or depth) $T_{130}$ of one of the conductive connectors (e.g., 130A, 130B) is less than a thickness $T_{120}$ of the insulating encapsulation 120 (e.g., measured from a top surface 120a to a bottom surface 120b). For example, the extremities of the conductive connectors 130A and 130B opposite to the redistribution structure 140 are embedded in the insulating encapsulation 120. Each of the conductive connectors 130A and 130B includes a first surface S1 and a second surface S2 opposing to each other, and a sidewall SW connected to the first surface S1 and the second surface S2. For example, the first surfaces S1 of the conductive connectors 130A and 130B are in physical contact with the redistribution structure 140. The second surfaces S2 and the sidewalls SW of the conductive connectors 130A and 130B may be in physical contact with the insulating encapsulation 120. In some embodiments, the sidewall SW of each of the conductive connectors 130A and 130B is slanted. The surface area of the first surface S1 may be greater than that of the second surface S2. For example, each of the conductive connectors 130A and 130B is tapered from the first surface S1 to the second surface S2.

In some embodiments, a thickness $T_{110}$ of the semiconductor die 110 is greater than the thickness $T_{130}$ of one of the conductive connectors 130A and 130B. For example, the semiconductor die 110 includes an active surface AS and a rear surface RS opposite to the active surface AS, and the thickness $T_{110}$ of the semiconductor die 110 may be measured from the active surface AS to the rear surface RS. In some embodiments, a die attach film DAF is disposed on the rear surface RS of the semiconductor die 110. The bottom surface 120b of the insulating encapsulation 120 may be substantially coplanar with the die attach film DAF. Alternatively, the die attach film DAF is removed from the rear surface RS of the semiconductor die 110 as will be described later in other embodiments. Accordingly, the die attach film DAF in FIG. 1 is illustrated as dashed to indicate it may or may not be present.

In some embodiments, the semiconductor die 110 is singulated from a device wafer. The semiconductor die 110 may be a logic die (e.g., central processing unit (CPU), graphics processing unit (GPU), system-on-a-chip (SoC), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), the like, or a combination thereof. It should be appreciated that more than one semiconductor dies may be disposed in the semiconductor device SD1 depending on the product requirements as will be described later in other embodiments.

For example, the semiconductor die 110 includes a semiconductor substrate 112 and a plurality of conductive bumps 114. In some embodiments, the semiconductor die 110 includes a plurality of conductive pads (not shown) formed over the semiconductor substrate 112, and a passivation layer (not shown) formed over the semiconductor substrate 112 and exposing at least a portion of the conductive pads. The conductive bumps 114 may be formed on the conductive pads. The active surface AS of the semiconductor die 110 may be referred to as a surface where the conductive bumps 114 are distributed for further electrical connection. The semiconductor substrate 112 may be a substrate including active components (e.g., transistors or the like) and/or passive components (e.g., resistors, capacitors, inductors or the like) formed therein. In some embodiments, the semiconductor substrate 112 includes an interconnection (not shown) formed on the semiconductor substrate 112, and the conductive pads distributed on the semiconductor substrate 112 are in electrical contact with the active/passive components through the interconnection. For example, the conductive pads include aluminum pads, copper pads, or other suitable metal pads. The passivation layer may include a plurality of contact openings exposing at least a portion of the conductive pads. The passivation layer may be a silicon oxide layer, a silicon nitride layer, a silicon oxy-nitride layer, or a dielectric layer formed by other suitable dielectric materials. More than one passivation layer may be formed over the semiconductor substrate 112. For example, the passivation layer further includes a polyimide (PI) layer, a polybenzoxazole (PBO) layer, or a dielectric layer made of other suitable dielectric polymers, which may be referred to as a post-passivation layer in accordance with some embodiments. The conductive bumps 114 may be formed in the contact openings of the passivation layer to be in physical and electrical contact with the conductive pads. In some embodiments, the conductive bumps 114 are plated copper pillars, gold pillars, or other suitable metallic pillars with or without covered by solder caps (e.g., lead-free solder caps). In certain embodiments, a protection layer (not shown) is formed on the passivation layer to cover the conductive bumps 114 for preventing the conductive bumps 114 from damage during processing (e.g., a pick-and-place process). Alternatively, the protection layer is omitted.

In some embodiments, the active surface AS of the semiconductor die 110 is substantially coplanar with the top surface 120a of the insulating encapsulation 120. The thickness $T_{120}$ of the insulating encapsulation 120 may be substantially equal to the combination of the thickness $T_{110}$ of the semiconductor die 110 and the thickness of the die attach film DAF. In some embodiments, the conductive bumps 114 are accessibly revealed by the insulating encapsulation 120. In certain embodiments in which the protection layer is formed on the passivation layer, the conductive bumps 114 may be laterally covered by the protection layer such that the conductive bumps 114 are accessibly revealed, and the protection layer is laterally encapsulated by the insulating encapsulation 120.

The redistribution structure 140 is fabricated to electrically connect to one or more conductive connectors underneath. The redistribution structure 140 may be formed on the active surface AS of the semiconductor die 110, the first surfaces S1 of the conductive connectors 130A and 130B, and the top surface 120a of the insulating encapsulation 120. For example, the redistribution structure 140 includes a plurality of patterned dielectric layers 142 and a plurality of patterned conductive layers 144 stacked alternately. The patterned conductive layers 144 are electrically connected to the conductive bumps 114 of the semiconductor die 110 and the conductive connectors 130A and 130B embedded in the insulating encapsulation 120. The active surface AS of the semiconductor die 110 and the first surfaces S1 of the conductive connectors 130A and 130B are accessibly revealed by the bottommost one of the patterned dielectric layers 142. The patterned conductive layers 144 may include various conductive features (e.g., lines, vias, pads, etc.). In some embodiments, the topmost one of the patterned conductive layers 144 may include a plurality of ball pads or under-ball metallurgy (UBM) pattern for further electrical connection. The conductive terminals 150 may be formed on the topmost one of the patterned conductive layers 144. The conductive terminals 150 may be ball grid array (BGA) terminals, solder balls, metal pillars, controlled collapse chip connection (C4) bumps, micro bumps, electroless nickel-electroless palladium-immersion gold (ENEPIG) formed bumps, or the like. The semiconductor device SD1 such as described above may be referred to as an integrated fan-out (InFO) package, in which the patterned conductive layers 144 of the redistribution structure 140 may be considered as fan-out wirings that extend between conductive bumps 114 of the semiconductor die 110 and the conductive terminals 150.

Figure 2:
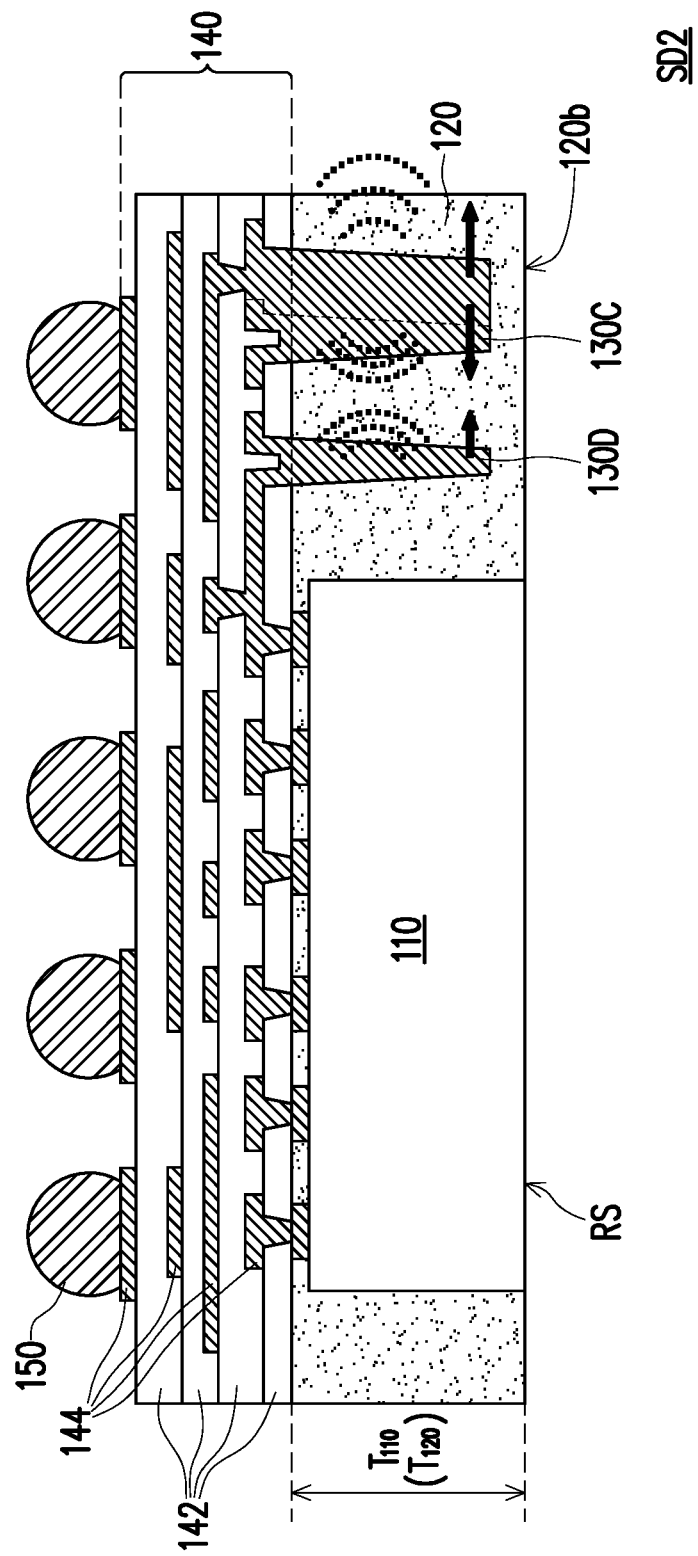

Referring to FIG. 2, a semiconductor device SD2 is provided. The semiconductor device SD2 is similar to the semiconductor device SD1 shown in FIG. 1, and the difference includes the sizes and/or the functions of the conductive connectors to achieve a variety of special purposes. For example, the conductive connector 130C and the conductive connector 130D are of different sizes and/or different aspect ratios. In some embodiments, the conductive connector 130C disposed remote from the semiconductor die 110 has a larger size (e.g., diameter) than the conductive connector 130D disposed between the semiconductor die 110 and the conductive connector 130C. In some embodiments, the semiconductor die 110 includes outputs and/or inputs for wireless communication. The dashed curves illustrated in FIG. 2 show characteristics of the conductive connectors 130C and 130D. For example, the conductive connector 130C with the larger size may function as an antenna, and the conductive connector 130D with the smaller size may function as a reflector. As indicated by the arrows in FIG. 2, the conductive connector 130D may reflect signals to and from the conductive connector 130C functioning as the antenna, thereby increasing the radiation strength in a target direction.

The die attach film DAF is disposed on the rear surface RS of the semiconductor die 110, and the die attach film DAF may be used for attaching to another package component. Alternatively, the die attach film DAF may be removed, and the rear surface RS of the semiconductor die 110 may be planarized. In some embodiments, the rear surface RS of the semiconductor die 110 is substantially coplanar with the bottom surface 120b of the insulating encapsulation 120. The thickness $T_{110}$ of the semiconductor die 110 may be substantially equal to the thickness $T_{120}$ of the insulating encapsulation 120.

Figure 3:
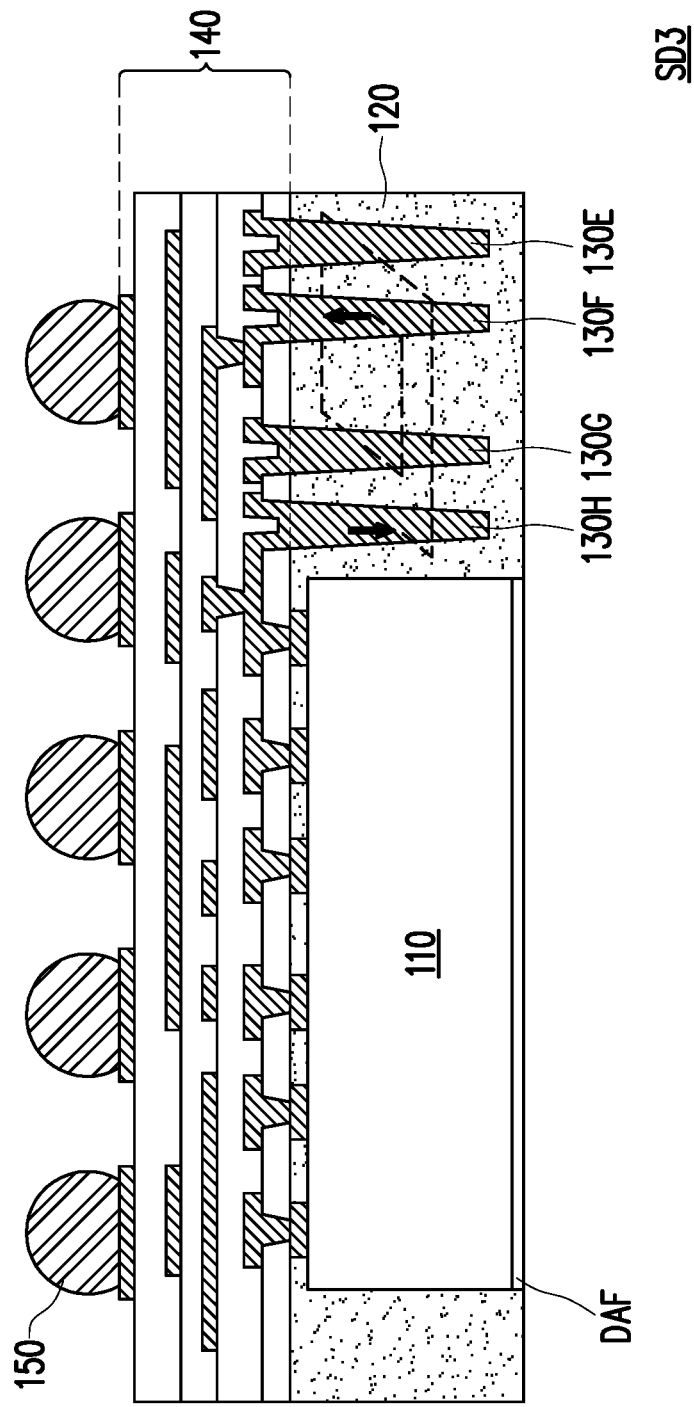

Referring to FIG. 3, a semiconductor device SD3 is provided. The semiconductor device SD3 may be a fan-out package including the semiconductor die 110 and a conductive loop integrated therein. For example, the conductive loop is formed by the conductive connectors 130E, 130F, 130G, and 130H. The conductive loop may be disposed aside and electrically coupled to the semiconductor die 110. In some embodiments, the conductive loop functions as a spiral coil inductor. For example, the dashed lines shown in FIG. 3 indicate the winding direction of the spiral coil. In some embodiments, the semiconductor die 110 (e.g., a Radio-frequency identification (RFID) die, a wireless charging die, or the like), and the conductive loop may form a system for a specified wireless application. The conductive loop may be arranged in a foursquare shape, an equilateral polygon shape, a circular shape, or the like, from a top view (not shown). In a cross-sectional view as FIG. 3, the conductive loop formed by the conductive connectors 130E, 130F, 130G, and 130H may have a tapered cross-section or other cross-sections (e.g., rectangular cross-sections, polygon cross-sections, circular cross-sections, oval cross-sections, or the like). In some embodiments, the conductive loop formed by the conductive connectors 130E, 130F, 130G, and 130H includes two terminals coupled to the semiconductor die 110, one receiving an input of electrical current (e.g., from the semiconductor die 110), and the other with the electrical current flowing back to the semiconductor die 110 as indicated by the arrows.

Figure 4:
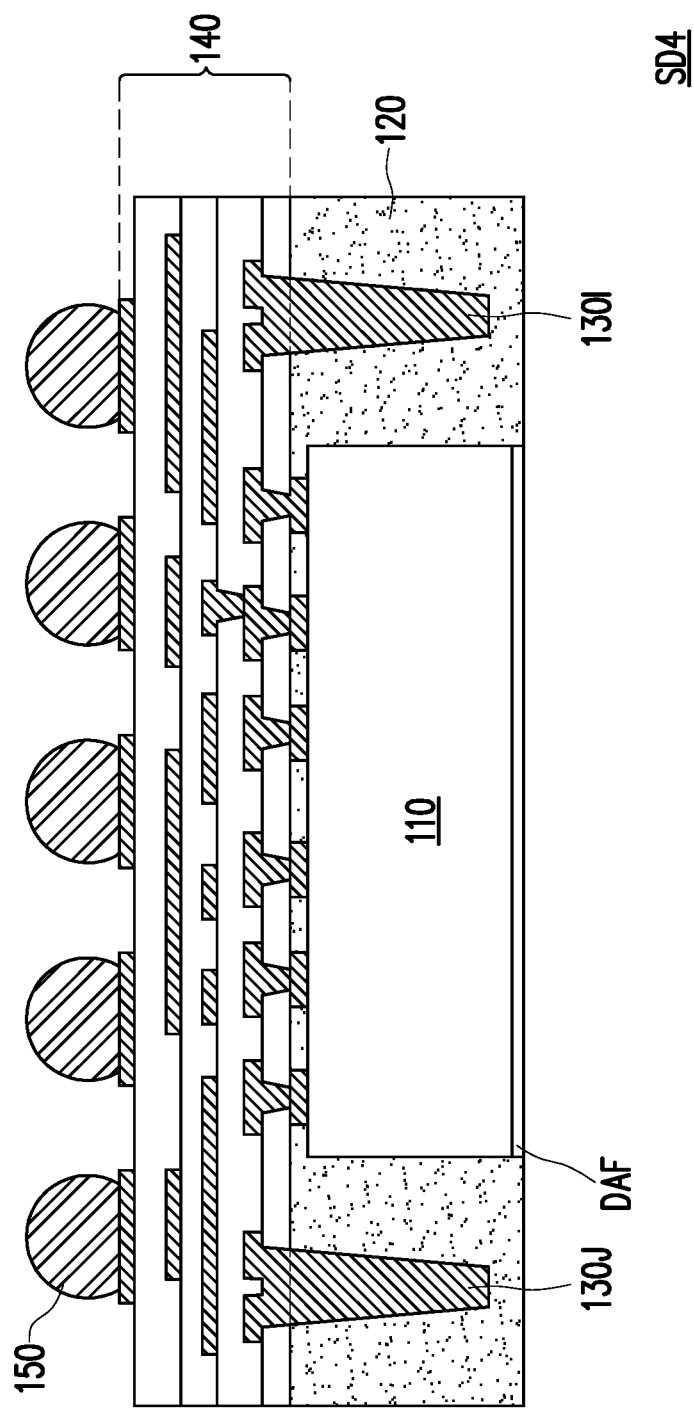

Referring to FIG. 4, a semiconductor device SD4 is provided. The semiconductor device SD4 includes the conductive connectors 130I and 130J respectively disposed two opposite sides of the semiconductor die 110. In some embodiments, a conductive frame is configured to enclose the semiconductor die 110 from a top view (not shown). For example, the conductive frame is formed by the conductive connectors 130I and 130J, and may function as an electromagnetic interference (EMI) shield, such that the semiconductor die 110 is protected from the outside interference. In some other embodiments, the conductive connectors 130I and 130J may be thermally coupled to the semiconductor die 110, and the conductive frame formed by the conductive connectors 130I and 130J may provide a thermal pathway from the semiconductor device SD4. For example, the conductive frame formed by the conductive connectors 130I and 130J is disposed around the semiconductor die 110 to assist in the thermal management. For example, during the operation of the semiconductor device SD4, the heat is initially generated from the semiconductor die 110, and then the heat may laterally travel to the conductive connectors 130I and 130J, and then go through the redistribution structure 140 to the conductive terminals 150 where the heat can be easily dispersed. By disposing the conductive frame formed by the conductive connectors 130I and 130J around the semiconductor die 110, the heat generated from the semiconductor die 110 may be quickly dissipated so as to lower the heat accumulation within the semiconductor device SD4.

Figure 5A:
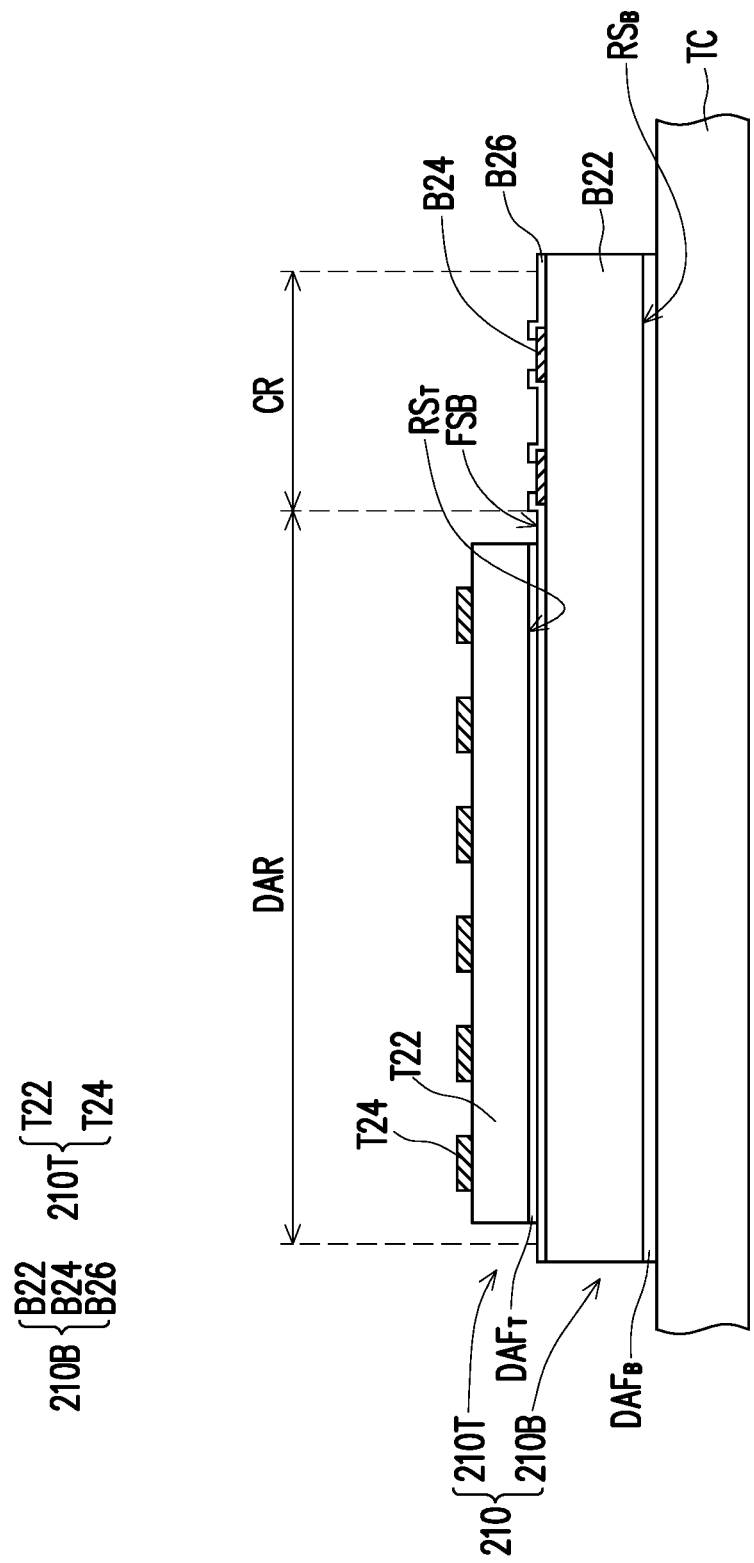
FIG. 5A to FIG. 5H are schematic cross-sectional views of various stages of manufacturing a semiconductor device in accordance with some exemplary embodiments of the disclosure.
Figure 5B:
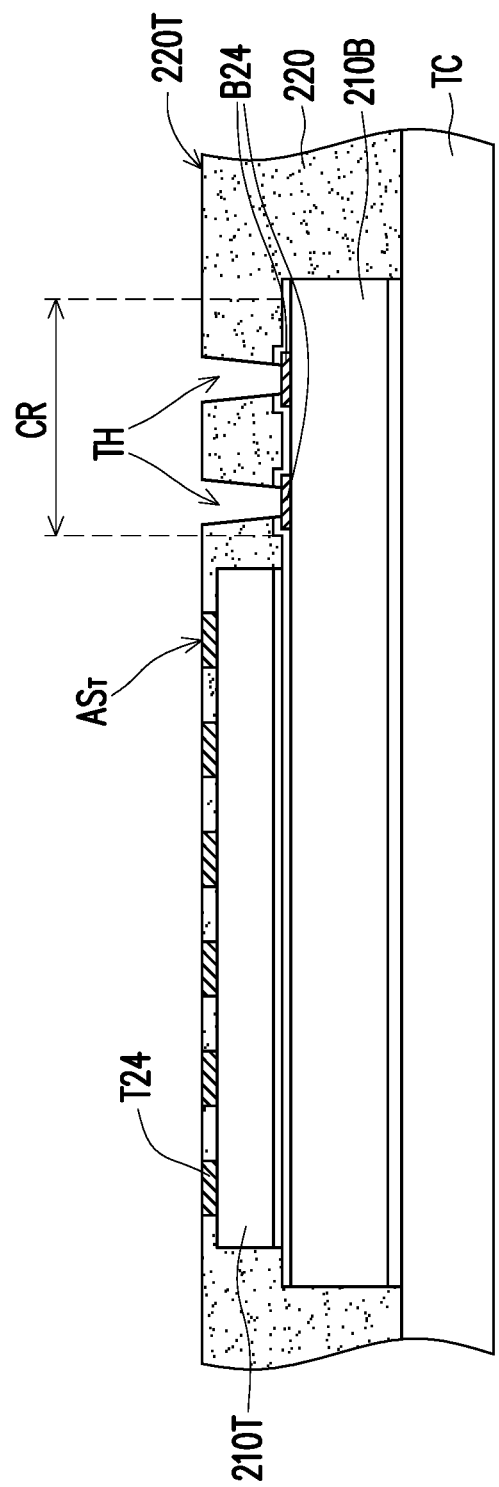
Figure 5C:
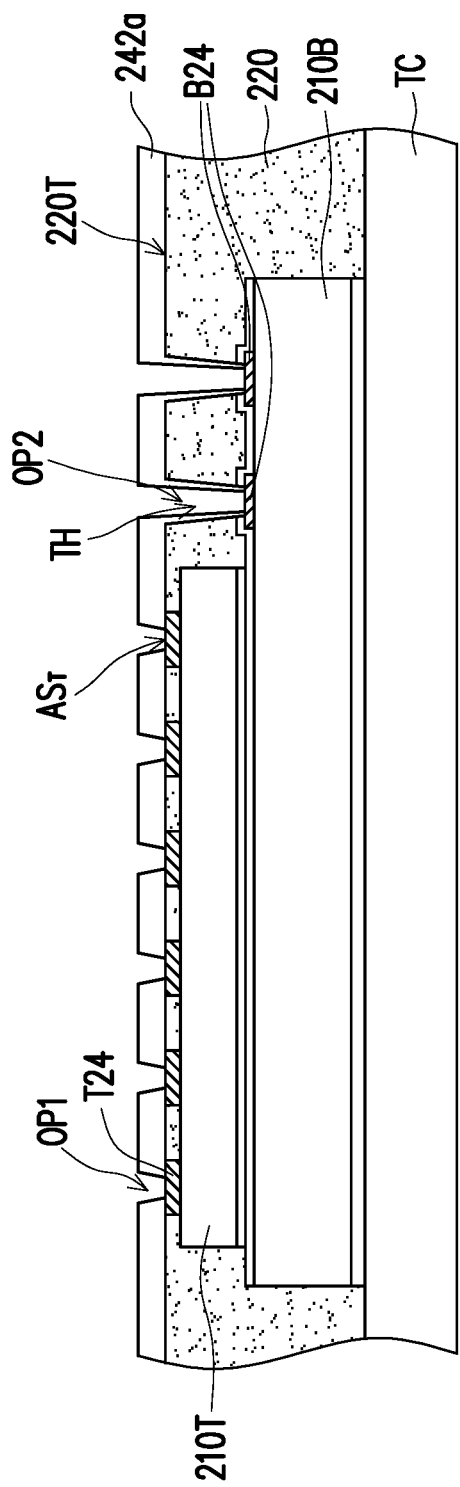
Figure 5D:
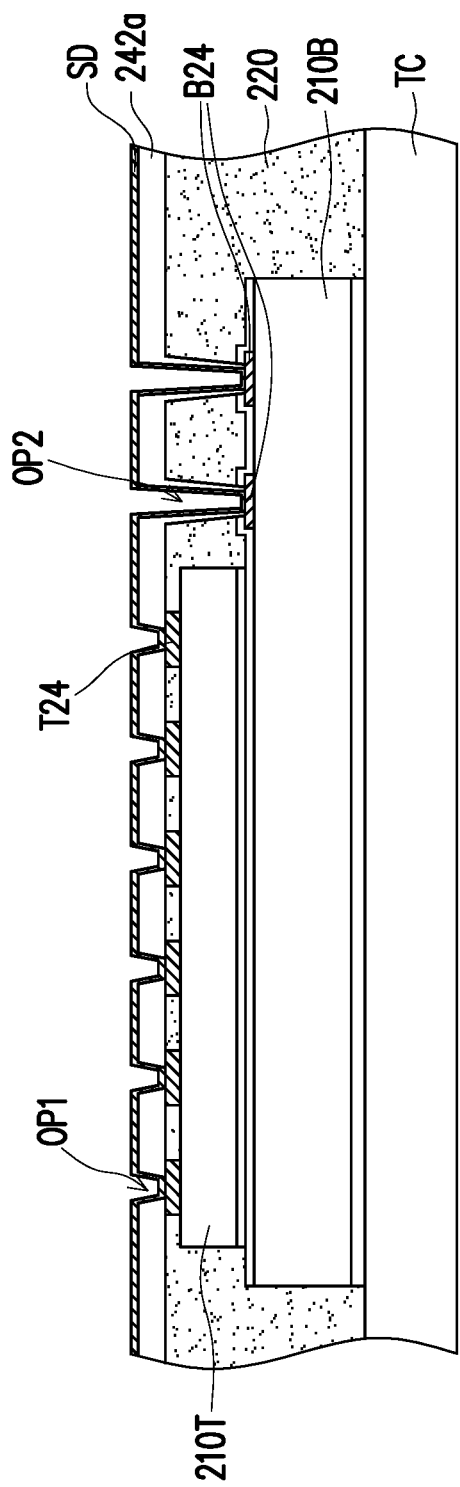
Figure 5E:
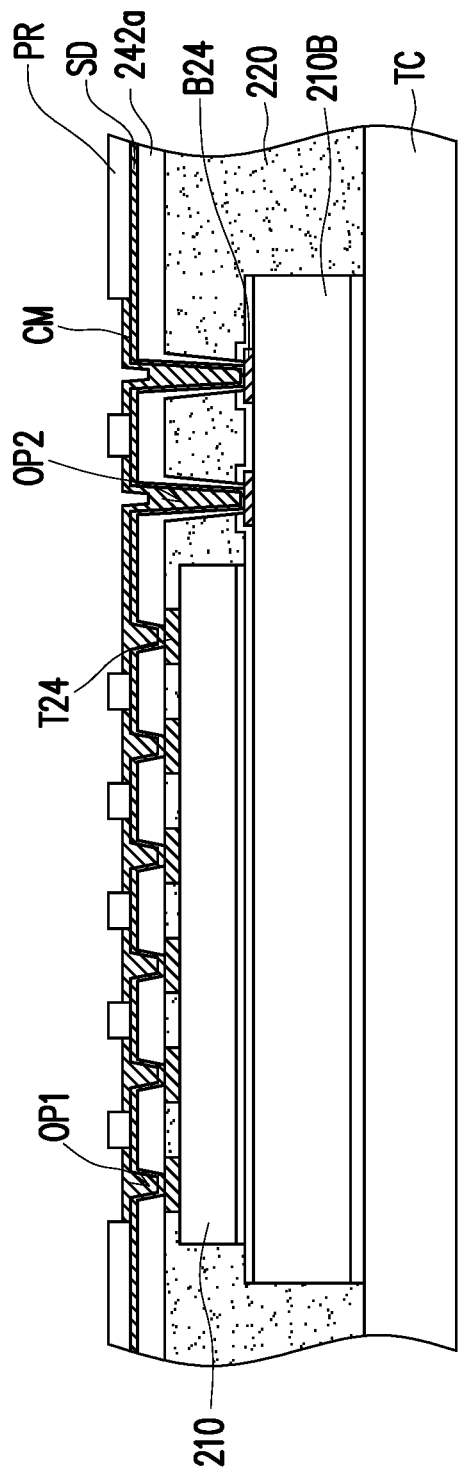
Figure 5F:
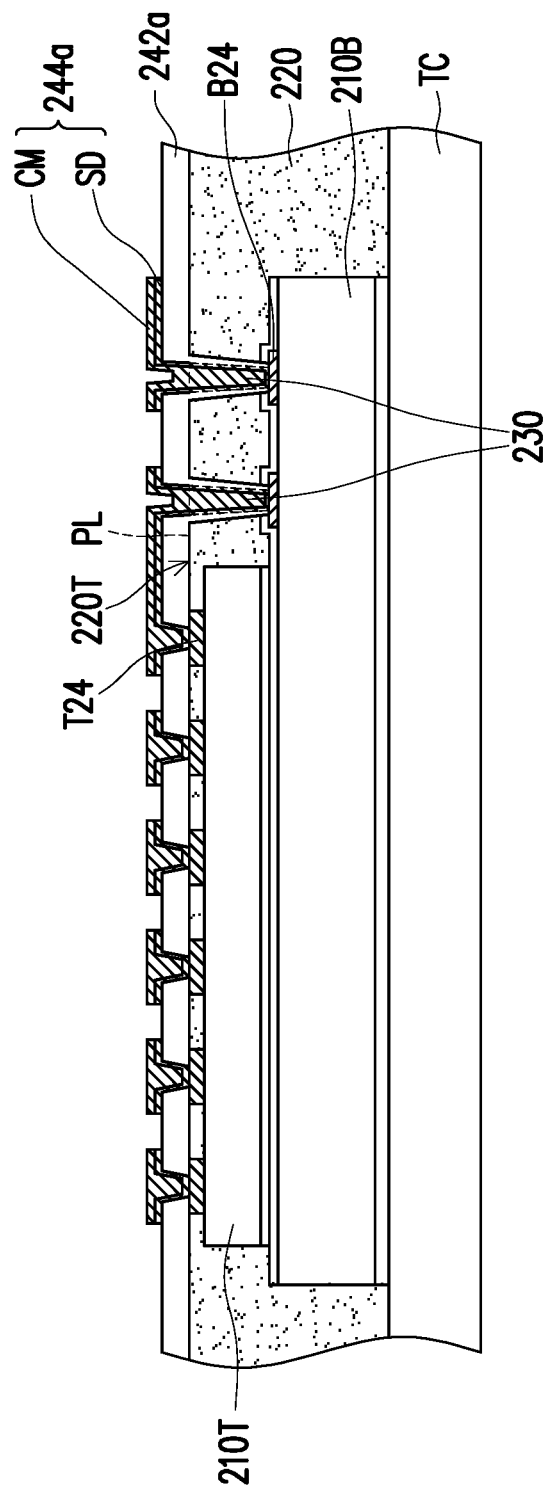
Figure 5G:
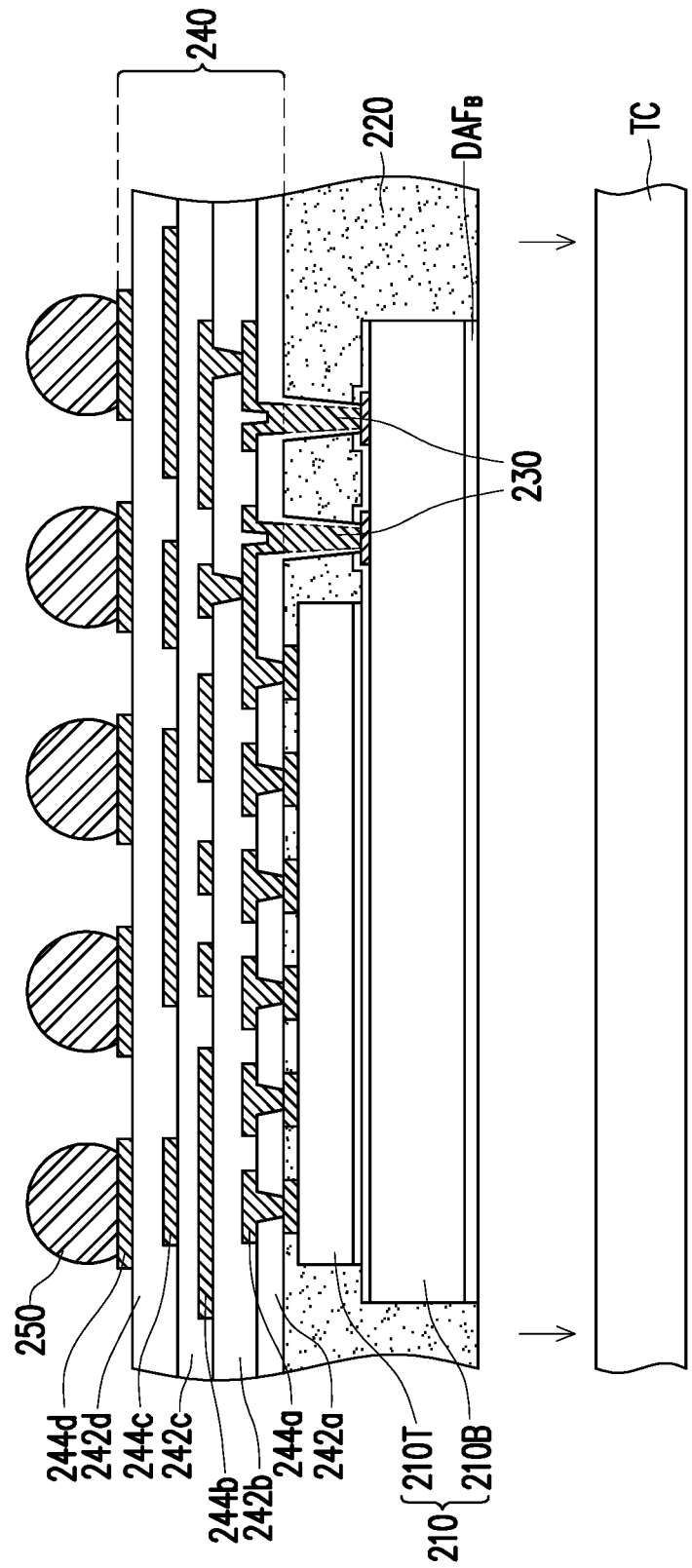
Figure 5H:
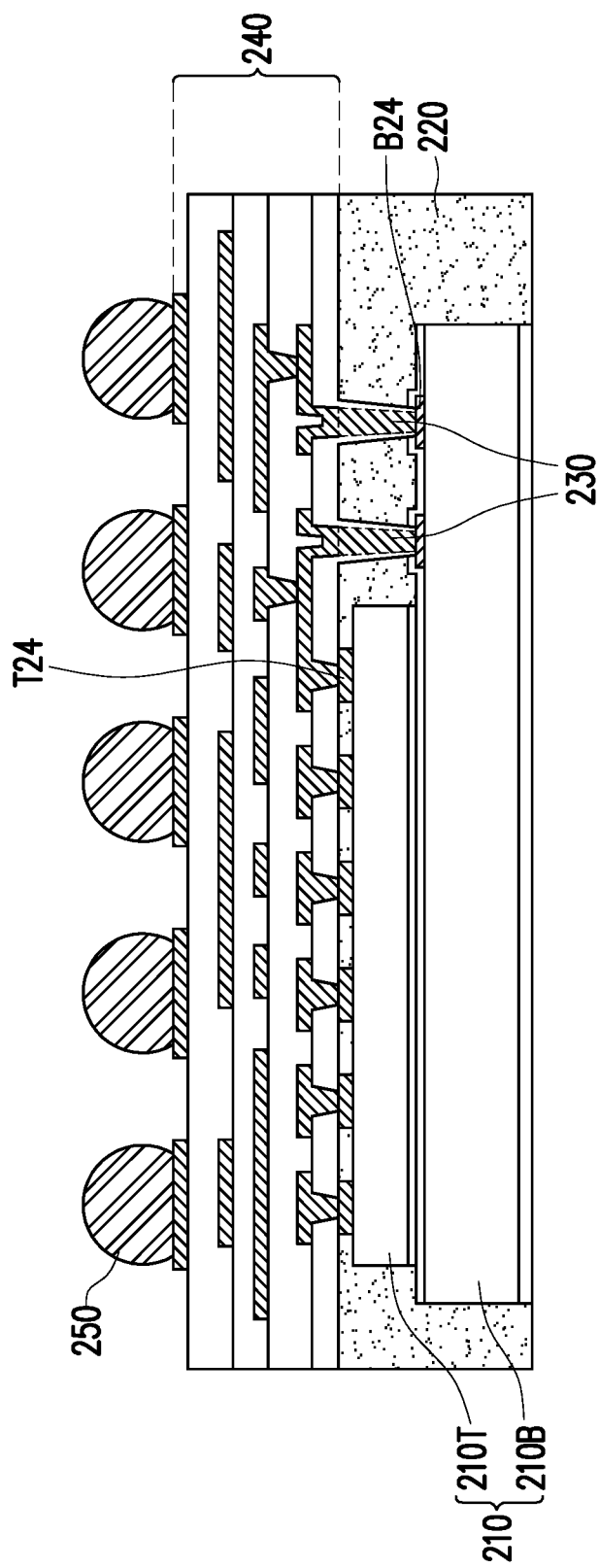
Figure 6:
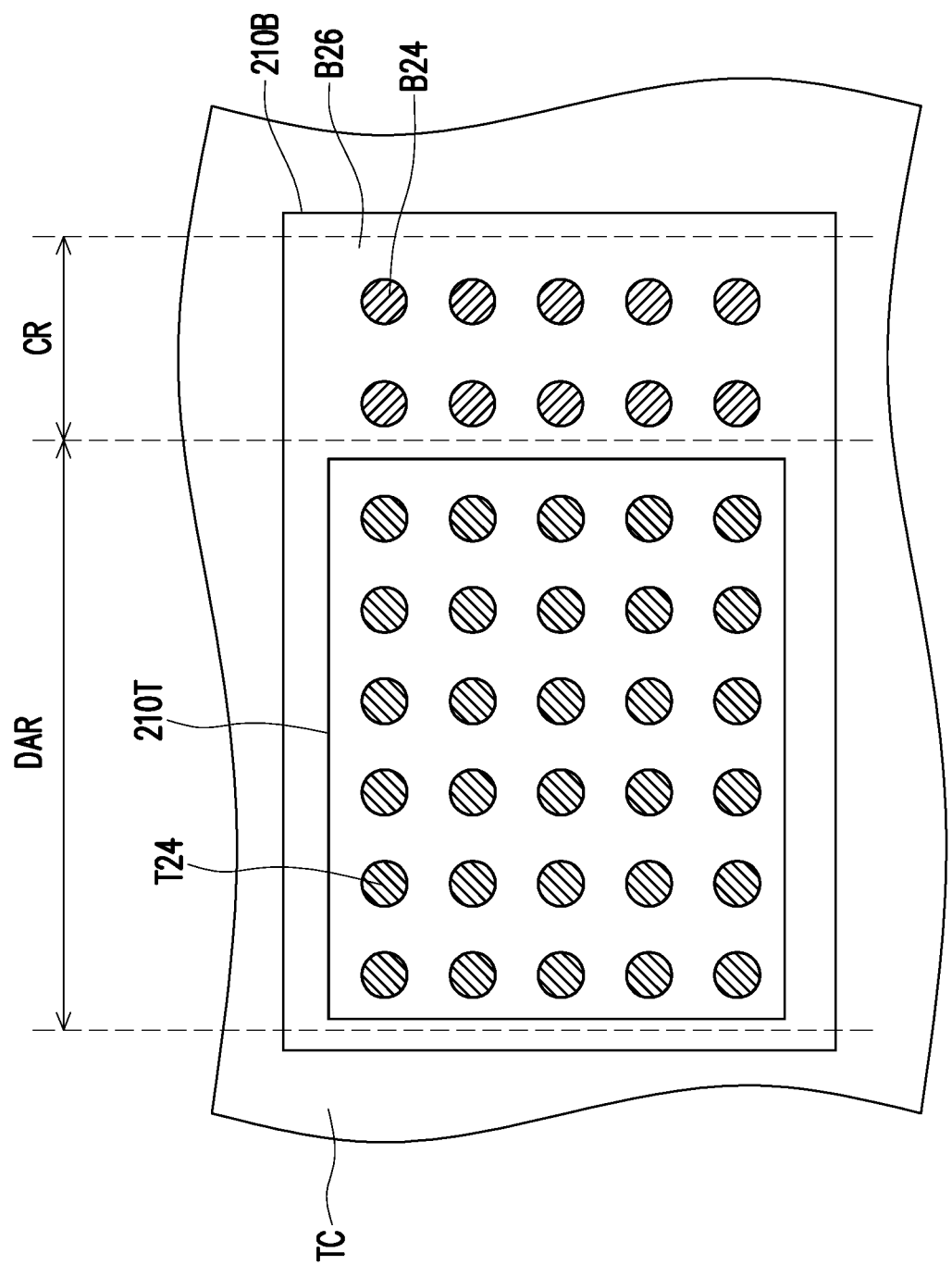
FIG. 6 is a schematic top view illustrating a die stack configuration in accordance with some exemplary embodiments of the disclosure.

FIG. 5A to FIG. 5H are schematic cross-sectional views of various stages of manufacturing a semiconductor device in accordance with some exemplary embodiments of the disclosure, and FIG. 6 is a schematic top view illustrating a die stack configuration in accordance with some exemplary embodiments of the disclosure. Referring to FIG. 5A and FIG. 6, a die stack 210 including a bottom semiconductor die 210B and a top semiconductor die 210T stacked upon one another is provided. In some embodiments, the bottom semiconductor die 210B and the top semiconductor die 210T are respectively provided with die attach films $DAF_B$ and $DAF_T$ adhered to the rear surfaces $RS_B$ and $RS_T$ of the bottom semiconductor die 210B and the top semiconductor die 210T. For example, the bottom semiconductor die 210B is picked and placed on a temporary carrier TC with the die attach film $DAF_B$ attached between the bottom semiconductor die 210B and the temporary carrier TC. Subsequently, the top semiconductor die 210T is picked and placed on the bottom semiconductor die 210B so that the rear surface $RS_T$ of the top semiconductor die 210T is bonded to a front surface $FS_B$ of the bottom semiconductor die 210B through the die attach films $DAF_T$, so as to form the die stack 210 on the temporary carrier TC.

The temporary carrier TC may include any suitable material that can provide structural support during semiconductor processing. For example, a material of the temporary carrier TC includes metal, glass, ceramic, silicon, combinations thereof, multi-layers thereof, or the like. In some embodiments, a de-bonding layer (not shown) is provided on the temporary carrier TC, and the bottom semiconductor die 210B is placed on the de-bonding layer. For example, the de-bonding layer is a light-to-heat conversion (LTHC) release layer which can aid the removal of the temporary carrier TC in the subsequent processes. The die stack 210 may further include additional die/chip(s) of the same type or different types.

In some embodiments, the bottom semiconductor die 210B and the top semiconductor die 210T are different types of dies. For example, the bottom semiconductor die 210B includes a bottom semiconductor substrate B22, a plurality of conductive pads B24 disposed on the bottom semiconductor substrate B22, and a passivation layer B26 formed over the bottom semiconductor substrate B22 and having a plurality of contact openings to expose at least a portion of the conductive pads B24. The bottom semiconductor substrate B22 may be a silicon substrate including active components (e.g., transistors, or the like) and/or passive components (e.g., resistors, capacitors, inductors, or the like) formed therein. The conductive pads B24 may be aluminum pads, copper pads, or other suitable metallic pads. The passivation layer B26 may include stacked multi-sublayers (e.g., a silicon oxide layer, a silicon nitride layer, a polyimide (PI) layer, a polybenzoxazole (PBO) layer, or a dielectric layer formed by other suitable polymers). The bottom semiconductor die 210B may be provided without bumps formed on the conductive pads B24. In some embodiments, the top semiconductor die 210T includes a top semiconductor substrate T22 and a plurality of conductive bumps T24 distributed over the top semiconductor substrate T22 opposite to the rear surface $RS_T$. The top semiconductor substrate T22 may be similar to the bottom semiconductor substrate B22. The conductive bumps T24 may be plated copper bumps or other suitable metallic bumps which may be or may not be covered by solder caps. In some embodiments, the top semiconductor die 210T is similar to the semiconductor die 110 described above.

Continue to FIG. 5A and FIG. 6, after disposing the top semiconductor die 210T on the bottom semiconductor die 210B, the conductive pads B24 of the bottom semiconductor die 210B may be unmasked by the top semiconductor die 210T. In some embodiments, the conductive pads B24 are arranged in a row or an array at one side of the bottom semiconductor die 210B. The top semiconductor die 210T may be placed elsewhere on the bottom semiconductor die 210B so that the conductive pads B24 and the bottom semiconductor die 210B do not interference with each other. For example, the bottom semiconductor die 210B includes a die attaching region DAR and at least one connecting region CR connected to the die attaching region DAR. The conductive pads B24 may be distributed within the connecting region CR and the top semiconductor die 210T may be disposed on the die attaching region DAR. For example, the connecting region CR is located in proximity to one edge of the bottom semiconductor die 210B, and the die attaching region DAR may correspond to the inboard area of the bottom semiconductor die 210B. Alternatively, the conductive pads B24 are arranged within the die attaching region DAR as will be described later in other embodiments. Other configurations of the semiconductor dies (e.g., 210T, 210B) are possible.

Referring to FIG. 5B, an insulating encapsulation 220 is formed to encapsulate the die stack 210. For example, the insulating encapsulation 220 includes a plurality of through holes TH exposing at least a portion of the conductive pads B24 of the bottom semiconductor die 210B. At least a portion of the conductive bumps T24 of the top semiconductor die 210T is accessibly revealed by the through holes TH of the insulating encapsulation 220 for further electrical connection. For example, a top surface 220T of the insulating encapsulation 220 is substantially coplanar with the active surface $AS_T$ (where the conductive bumps T24 are distributed on) of the top semiconductor die 210T of the die stack 210. The insulating encapsulation 220 includes a molding compound (e.g., epoxy resins), a molding underfill, a dielectric material (e.g., polybenzoxazole, polyimide, benzocyclobutene, a combination thereof), or other suitable electrically insulating materials.

In an exemplary embodiment, the method of forming the insulating encapsulation 220 includes at least the following steps. An insulating material (not shown) is formed over the temporary carrier TC to wrap around the bottom semiconductor die 210B and the top semiconductor die 210T using, for example, compression molding, transfer molding, or other suitable techniques. In some embodiments, the die stack 210 is over-molded. A thinning process is optionally performed on the insulating material to reduce the thickness of the insulating material until at least a portion of the conductive bumps T24 of the top semiconductor die 210T are accessibly revealed. The thinning process may include a chemical-mechanical polish (CMP) process, a mechanical grinding process, or the like. The surface that the conductive bumps T24 are accessibly revealed may be referred to as the active surface $AS_T$ of the top semiconductor die 210T. Subsequently, a portion of the insulting material corresponding to the connecting region CR of the bottom semiconductor die 210B are removed to form the insulating encapsulation 220 with through holes TH. The through holes TH may reveal at least a portion of the conductive pads B24 for further electrical connection. For example, a laser drilling process is performed on the insulating material to form the through holes TH. Other techniques of forming the through holes TH (e.g., various etching techniques, waterjet drilling, ultrasonic drilling, or the like) may be utilized. In certain embodiments in which a laser drilling process is employed, the inner sidewalls of the insulating encapsulation 220 corresponding to the through holes TH are slanted. For example, the through holes TH may have the inverse trapezoidal shape in a cross section. In some embodiments, the profile of each through hole TH is tapered in a thickness direction of the insulating encapsulation 220. For example, the profile of each through hole TH is tapered from the top surface 220T of the insulating encapsulation 220 to the conductive pads B24 of the bottom semiconductor die 210B. It should be appreciated that cylindrical through holes may be formed depending on the direction of the laser energy. Moreover, it should be noted that the foregoing sequence merely serves as an illustrative example, and the disclosure is not limited thereto. In alternative embodiments, the process of forming the through holes TH may be prior to the thinning process of the insulating material.

Referring to FIG. 5C to FIG. 5F, after forming the insulating encapsulation 220, a plurality of conductive connectors 230 and a redistribution structure 240 are formed to be in electrical contact with the die stack 210. The redistribution structure 240 may include at least one patterned dielectric layer (e.g., 242a) and at least one patterned conductive layer (e.g., 244a). In some embodiments, the conductive connectors 230 and the bottommost one of the patterned conductive layer (e.g., 244a) are formed during the same process. The patterned conductive layer 244a and the conductive connectors 230 may be physically and electrically connected. In some embodiments, a portion of the bottommost one of the patterned dielectric layers 242a extends into the through holes TH of the insulating encapsulation 220 to be interposed between the inner sidewalls of the insulating encapsulation 220 and the conductive connectors 230. For example, the conductive connectors 230 are laterally wrapped by the patterned dielectric layer 242a, and longitudinally connected to the patterned conductive layer 244a and the conductive pads B24 of the bottom semiconductor die 210B.

In an exemplary embodiment, the method of forming the conductive connectors 230 and the redistribution structure 240 includes at least the following steps. The patterned dielectric layer 242a of the redistribution structure 240 is initially formed on the top surface 220T of the insulating encapsulation 220 and the active surface $AS_T$ of the top semiconductor die 210T, and also formed inside the through holes TH of the insulating encapsulation 220. The patterned dielectric layer 242a includes a plurality of first openings OP1 exposing at least a portion of the conductive bumps T24 of the top semiconductor die 210T, and a plurality of second openings OP2 corresponding to the through holes TH and exposing at least a portion of the conductive pads B24 of the bottom semiconductor die 210B. The method of forming the patterned dielectric layer 242a may include the following steps. A dielectric material (e.g., polybenzoxazole, polyimide, benzocyclobutene, or other suitable material that is electrically insulating) is formed on the top surface 220T of the insulating encapsulation 220 and the active surface $AS_T$ of the top semiconductor die 210T, and also formed inside the through holes TH of the insulating encapsulation 220 using such as spin-coating, deposition, or the like. Next, a portion of the dielectric material is removed to form the first openings OP1 and the second openings OP2 using lithography and etching processes or other suitable removing process. In some embodiments, the patterned dielectric layer 242a is laid over the top surface 220T of the insulating encapsulation 220 and the active surface $AS_T$ of the top semiconductor die 210T, extends into the through holes TH to cover the inner sidewalls of the insulating encapsulation 220. The extremity of the patterned dielectric layer 242a extending into the through holes TH may be in physical contact with the circumferences of the conductive pads B24. Alternatively, the inner sidewalls of the insulating encapsulation 220 is not covered by the patterned dielectric layer 242a, and the through hole TH of the insulating encapsulation 220 is free from the patterned dielectric layer 242a as will be described later in other embodiments.

Continue to FIG. 5D, a seed layer SD may be conformally formed on the patterned dielectric layer 242a. For example, the seed layer SD is formed on the surface of the patterned dielectric layer 242a, and also formed inside the first openings OP1 and the second openings OP2 so as to be in electrical and physical contact with the conductive bumps T24 of the top semiconductor die 210T and the conductive pads B24 of the bottom semiconductor die 210B. In some embodiments, the seed layer SD is a thin layer of a conductive material that aids in the formation of a thicker conductive layer during subsequent processing steps. For example, the seed layer SD is a copper layer, a titanium/copper composite layer, or other suitable metallic layer, and may be formed using thin-film deposition such as physical vapor deposition (e.g., sputtering), evaporation, or other suitable techniques.

Continue to FIG. 5E, a sacrificial layer PR is formed on the seed layer SD. The sacrificial layer PR has been patterned to have a plurality of openings exposing the intended locations for the subsequently formed conductive material layer. Portions of the openings of the sacrificial layer PR may correspond to the first openings OP1 of the patterned dielectric layer 242a, and other portions of the openings of the sacrificial layer PR may correspond to the second openings OP2 of the patterned dielectric layer 242a. The sacrificial layer PR may include a photoresist material (e.g., polymethyl methacrylate (PMMA) or the like). In an exemplary embodiment, the method of forming the sacrificial layer PR includes the following steps. The photoresist material is initially formed on the seed layer SD using such as spin-coating or other deposition techniques. Next, the photoresist material is patterned to form the sacrificial layer PR with the openings using such as lithography and etching processes, a laser drilling process, or the like.

Subsequently, a conductive material layer (e.g., copper, aluminum, gold, nickel, silver, palladium, tin, etc.) CM may be formed inside the openings of the sacrificial layer PR by plating (e.g., electro-plating, electroless-plating, immersion plating), sputtering, or other suitable deposition process. By forming the conductive material layer CM into the openings of the sacrificial layer PR, the conductive material layer CM may take on the pattern of the openings of the sacrificial layer PR, and the conductive material layer CM is in electrical and physical contact with the seed layer SD. A Part of the conductive material layer CM is formed in the first openings OP1 of the patterned dielectric layer 242a, and other part of the conductive material layer CM may be formed in the second openings OP1 of the patterned dielectric layer 242a.

Continue to FIG. 5F, after forming the conductive material layer CM on the seed layer SD, the sacrificial layer PR may be removed by, for example, dissolving the sacrificial layer PR in suitable solvent, etching the sacrificial layer PR using wet chemistry with an appropriate chemical solution, plasma etching, reactive ion etching (RIE), or other suitable removal processes. Subsequently, by using the conductive material layer CM as a mask, a part of the seed layer SD that is unmasked by the conductive material layer CM may be removed until the patterned dielectric layer 242a is exposed. The portions of the conductive material layer CM and the underlying seed layer SD in combination that are formed inside the through holes TH of the insulating encapsulation 220 may be viewed as the conductive connectors 230. The sidewalls of the conductive connectors 230 are wrapped by the portion of the patterned dielectric layer 242a extending into the through hole TH insulating encapsulation 220. The rest portions of the conductive material layer CM and the underlying seed layer SD in combination may be viewed as the patterned conductive layer 244a of the redistribution structure 240. For example, the boundary of the conductive connectors 230 and the patterned conductive layer 244a of the redistribution structure 240 may be defined on a reference plane PL (e.g., where the top surface 220T of the insulating encapsulation 220 is located on). It should be noted that the aforementioned steps merely serve as an illustrative example, and the disclosure is not limited thereto. In addition, it should be noted that for ease of illustration in the following drawings, the conductive material layer CM and the seed layer SD are shown in combination as one layer.

Referring to FIG. 5G, in some embodiments, the redistribution structure 240 includes a plurality of patterned dielectric layers (e.g., 242a, 242b, 242c, 242d) and a plurality of patterned conductive layers (e.g., 244a, 244b, 244c, 244d) stacked alternatively. For example, after forming the bottommost one of the patterned dielectric layers 242a and the bottommost one of the patterned conductive layers 244a, a layer of dielectric material may be formed on the patterned dielectric layer 242a. Then, a portion of the layer of dielectric material may be removed to form a patterned dielectric layer 242b using, for example, lithography and etching process, or other suitable methods. The patterned dielectric layer 242b includes a plurality of openings exposing at least a portion of the underlying patterned conductive layer 244. Subsequently, a patterned conductive layer 244b is formed on the patterned dielectric layer 242b, and formed inside the openings of the patterned dielectric layer 242b to be in physical contact with the underlying patterned conductive layer 244a using patterning and metallization processing as described elsewhere herein. In some embodiments, the abovementioned steps may be performed multiple times to obtain a multi-layered redistribution structure as required by the circuit design. The numbers of the patterned dielectric layer and the patterned conductive layer may be selected based on demand, which are not limited in the disclosure. In alternative embodiments, the patterned conductive layer may be formed before forming the patterned dielectric layer, and the forming sequence thereof depends on the design requirements. In some embodiments, a portion of the topmost one of the patterned conductive layer 244d is referred to as under-ball metallurgy (UBM) pattern for the subsequent ball-mounting process. Alternatively, the topmost one of the patterned conductive layer 244d may include connection pads (not shown) for bonding electronic components (e.g., capacitors, resistors, inductors, etc.) depending on the product requirements.

Continue to FIG. 5G, one or more conductive terminals 250 may be formed on the topmost one of the patterned conductive layers 244d so that the conductive terminals 250 are electrically coupled to the die stack 210 through the redistribution structure 240 and the conductive connectors 230. In some embodiments, the conductive terminals 250 are made of a conductive material with low resistivity, such as Sn, Pb, Ag, Cu, Ni, Bi, or an alloy thereof. The conductive terminals 250 may be solder balls, ball grid array (BGA) balls, or other suitable conductive materials formed in other shapes. For example, the conductive terminals 250 are disposed on the UBM pattern of the patterned conductive layer 244d using a ball placement process and an optional reflow process. It should be noted that the number, the dimension, and the shape of the conductive terminals 250 are provided for illustrative purposes, which construe no limitation in the disclosure.

Still referring to FIG. 5G, after forming the conductive terminals 250, the temporary carrier TC may be separated from the insulating encapsulation 220 and the die stack 210. In some embodiments, the temporary carrier TC is detached from the insulating encapsulation 220 and the die stack 210 by irradiating the de-bonding layer (e.g., the LTHC release layer disposed on the temporary carrier TC; not shown) with UV light or laser beam. In some embodiments, after detaching the temporary carrier TC, the die attach film $DAF_B$ is remained on the bottom semiconductor die 210B. Alternatively, after detaching the temporary carrier TC, a cleaning and/or planarizing process is performed to remove the die attach film $DAF_B$ from the bottom semiconductor die 210B.

Referring to FIG. 5H, a semiconductor device SD5 is formed. In some embodiments, the aforementioned steps are performed at wafer level, and a singulation process may be performed after detaching the temporary carrier TC. For example, the dicing or singulation process is a laser cutting process, a mechanical cutting process, or other suitable process. To perform the singulation process, a dicing tape (not shown) may be applied to the conductive terminals 250, which may support the structure during the singulation process. Subsequently, the singulation process may be performed along singulation lines (not shown) to form individual semiconductor devices SD5. The semiconductor device SD5 may be referred to as an integrated fan-out (InFO) package. As shown in FIG. 5H, each semiconductor device SD5 includes the die stack 210 including the bottom semiconductor die 210B and the top semiconductor die 210T, the insulating encapsulation 220 protecting the die stack 210, the conductive connectors 230 inserting into the insulating encapsulation 220 to be in contact with the conductive pads B24 of the bottom semiconductor die 210B, the redistribution structure 240 disposed on the insulating encapsulation 220 to be in contact with the conductive bumps T24 of the top semiconductor die 210T and the conductive connectors 230, and the conductive terminals 250 disposed on the redistribution structure 240 for further electrical connection. The semiconductor device SD5 may be mounted onto another package component (e.g., an additional chip package, a package substrate, an electronic device, a circuit board, a system board, a mother board, etc.; not shown), and the signals of the die stack 210 may be transmitted to the package component through the conductive terminals 250.

Figure 7:
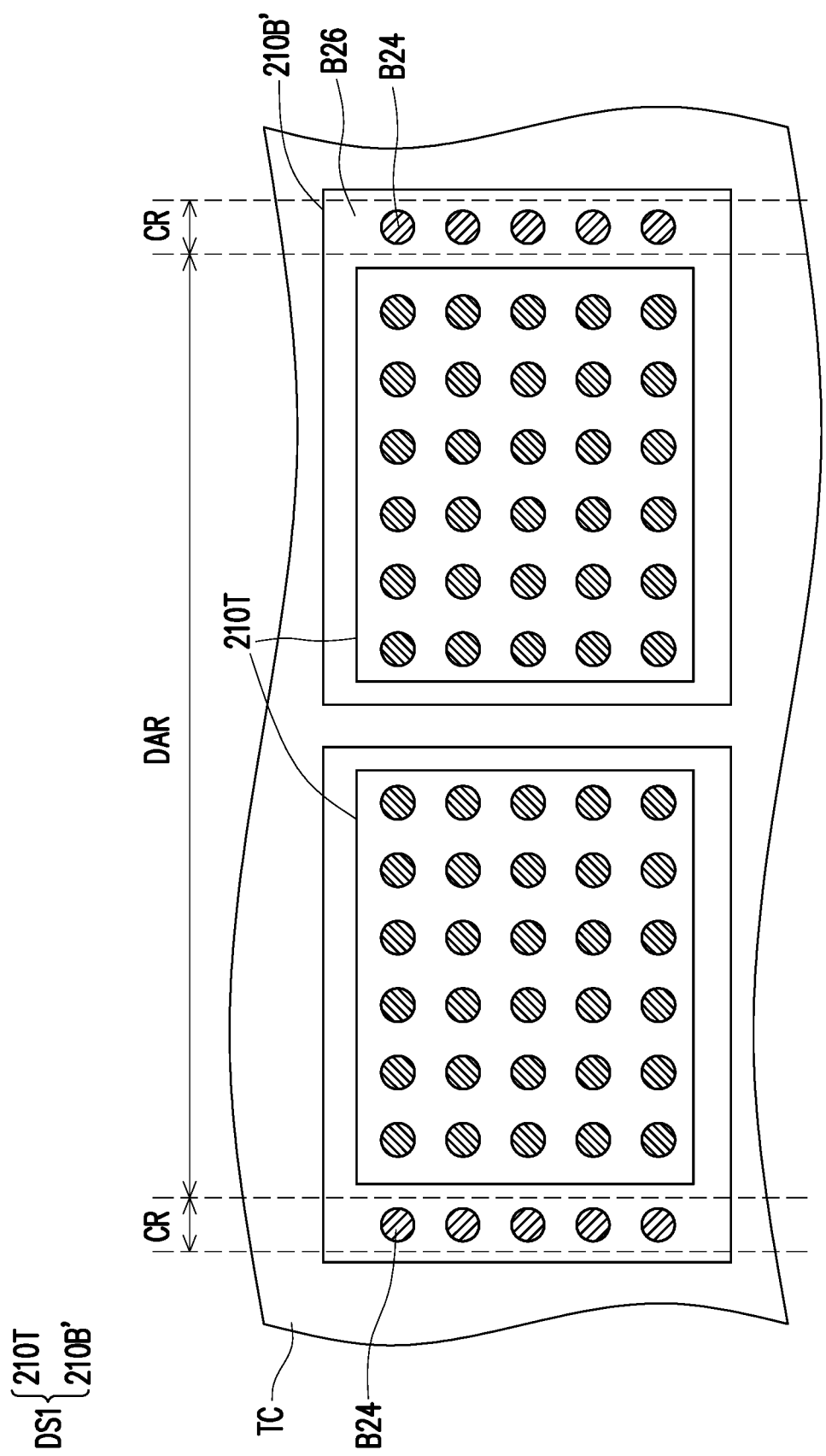
FIG. 7 is another schematic top view illustrating a die stack configuration in accordance with some exemplary embodiments of the disclosure.

FIG. 7 is another schematic top view illustrating a die stack configuration in accordance with some exemplary embodiments of the disclosure. Referring to FIG. 7, a die stack DS1 is provided on the temporary carrier TC. The die stack DS1 includes more than one top semiconductor dies 210T disposed on the bottom semiconductor die 210B'. For example, two of the connecting regions CR are located at two opposing sides of the of the bottom semiconductor die 210B, and the die attaching region DAR is between the connecting regions CR. The conductive pads B24 disposed within the connecting regions CR may be distributed along the two opposing sides of the bottom semiconductor die 210B, and the top semiconductor dies 210T disposed within die attaching region DAR may be placed on the inboard area of the bottom semiconductor die 210B, such that the conductive pads B24 and the top semiconductor dies 210T are not overlapped. The conductive pads B24 and the top semiconductor dies 210T may be arranged in a different manner. For example, the conductive pads B24 of the bottom semiconductor die 210B may be disposed along more than one side (or along the periphery) of the bottom semiconductor die 210B. Alternatively, the conductive pads B24 may be disposed in the corner(s) of the bottom semiconductor die 210B. It should be appreciated that the die stack configuration shown in FIG. 7 is provided for illustrative purposes, other configuration is possible as long as the conductive pads B24 are unmasked by the top semiconductor dies 210T.

Figure 8:
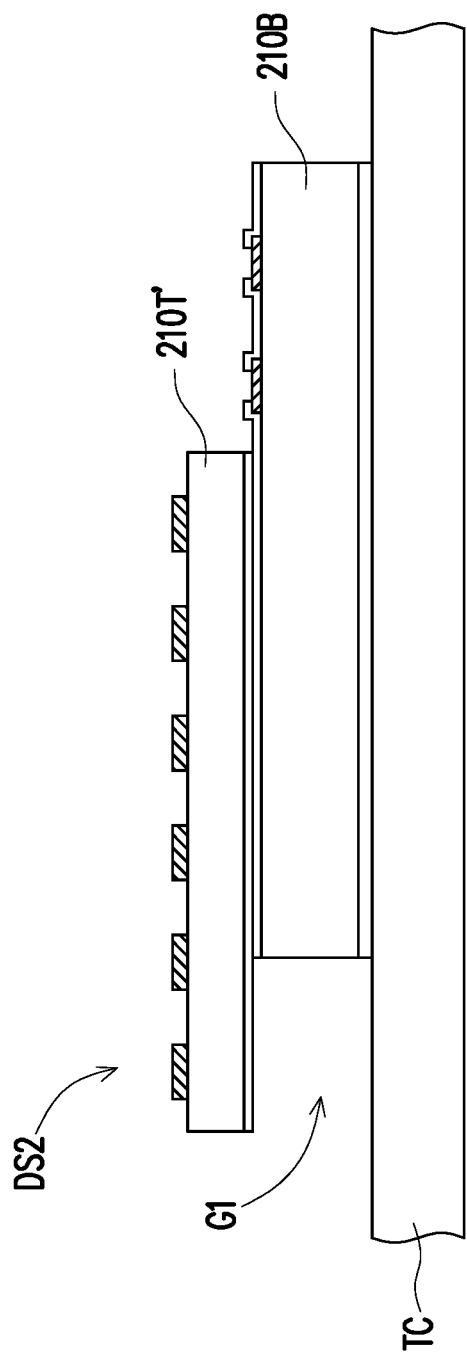
FIG. 8 to FIG. 10 are schematic cross-sectional views illustrating various die stack configurations in accordance with some exemplary embodiments of the disclosure.
Figure 9:
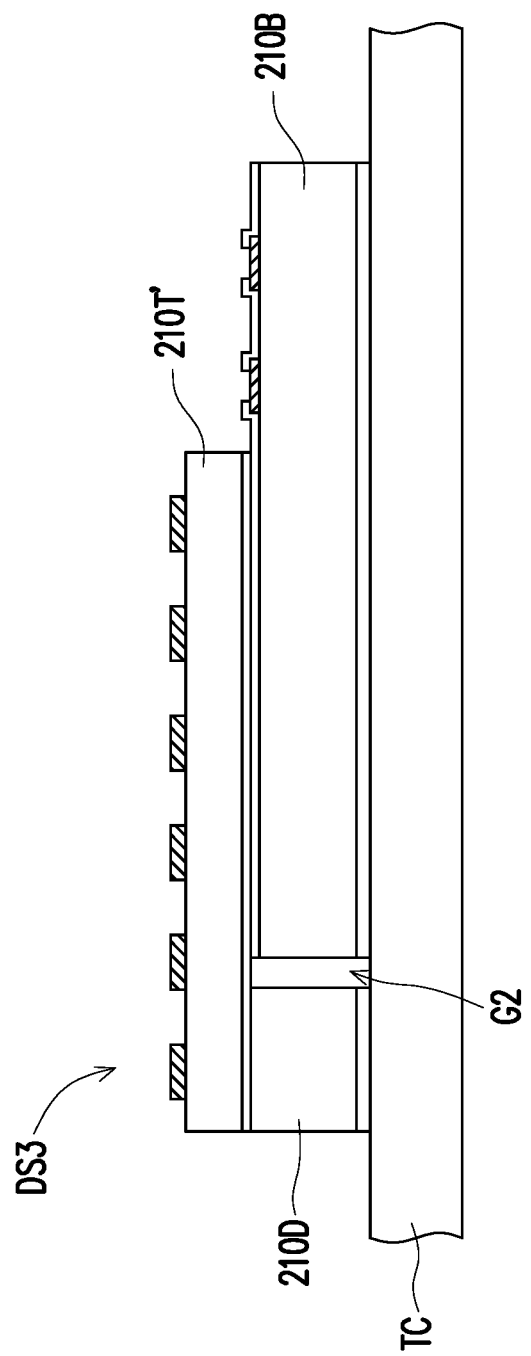
Figure 10:
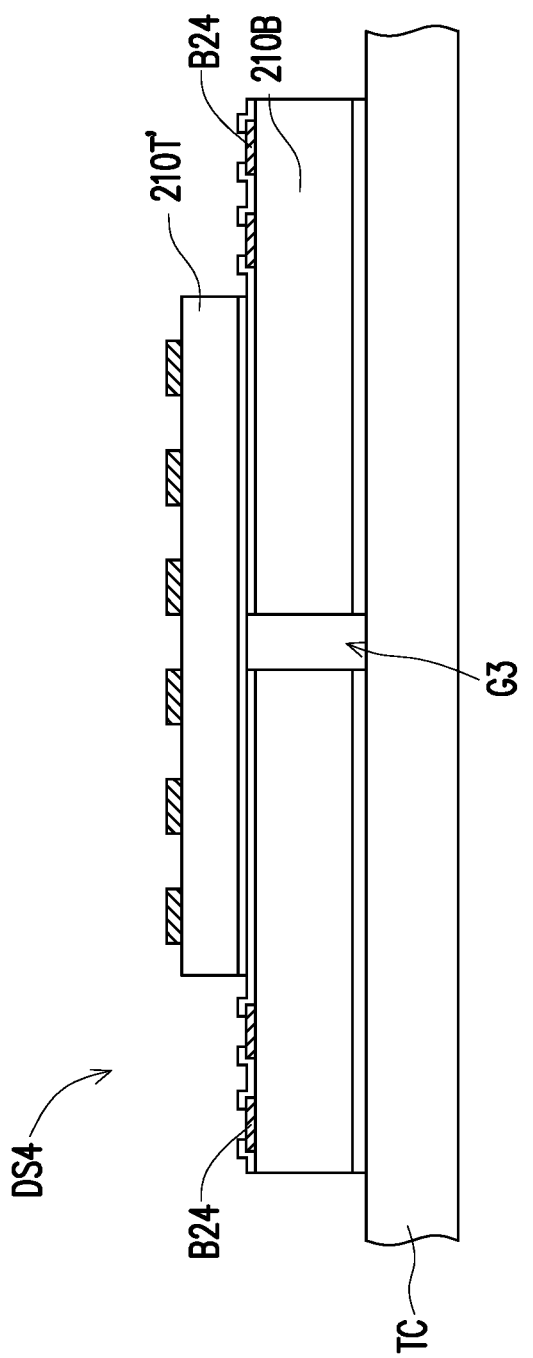

FIG. 8 to FIG. 10 are schematic cross-sectional views illustrating various die stack configurations in accordance with some exemplary embodiments of the disclosure. Referring to FIG. 8, a die stack DS2 is provided on the temporary carrier TC. The top semiconductor die 210T' may be disposed in a staggered and/or offset orientation with respect to the bottom semiconductor die 210B. For example, the top semiconductor die 210T' is staggered with respect to the bottom semiconductor die 210B along a first direction. The top semiconductor die 210T' may also be offset with respect to the bottom semiconductor die 210B along a second direction (e.g., perpendicular to the first direction). In certain embodiments in which the bottom semiconductor die 210B is not large enough to accommodate the entirety of the top semiconductor die 210T', a portion of the top semiconductor die 210T' does not overlap with the bottom semiconductor die 210B. The top semiconductor die 210T' is disposed beyond the edge of the bottom semiconductor die 210B, and a gap G1 is formed between the top semiconductor die 210T' and the temporary carrier TC. In some embodiments, additional bottom semiconductor dies 210B may be added to the die stack DS2 in a staggered fashion with respect to the semiconductor dies on which it is attached. It should be noted that the number of the semiconductor dies in the die stack depends on the product requirements.

Referring to FIG. 9, a die stack DS3 is provided on the temporary carrier TC. The die stack DS3 is similar to the die stack DS2 shown in FIG. 8, except that a dummy die 210D is disposed at the gap (e.g., the gap G1 labeled in FIG. 8) between the top semiconductor die 210T' and the temporary carrier TC. For example, the dummy die 210D is disposed beside the bottom semiconductor die 210B and a gap G2 is formed therebetween. The dummy die 210D may be singulated from a blank wafer. For example, the dummy die 210D is free from circuitry and/or electrical components. The dummy die 210D interposed between the top semiconductor die 210T' and the temporary carrier TC may support the top semiconductor die 210T' stacked thereon. In some embodiments, at least one edge of the dummy die 210D is aligned with the top semiconductor die 210T' stacked thereon.

Referring to FIG. 10, a die stack DS4 is provided on the temporary carrier TC. The die stack DS4 is similar to the die stack DS3 shown in FIG. 9, except that additional bottom semiconductor die 210B is disposed below the top semiconductor die 210T. A gap G3 may be formed between the adjacent bottom semiconductor dies 210B. The conductive pads B24 of these bottom semiconductor die 210B may be disposed in proximity to the edges of the bottom semiconductor dies 210B. The top semiconductor die 210T may extend over the gap G3 and the inboard areas of the bottom semiconductor die 210B, so that the top semiconductor die 210T does not overlap the conductive pads B24 of these bottom semiconductor die 210B.

Figure 11A:
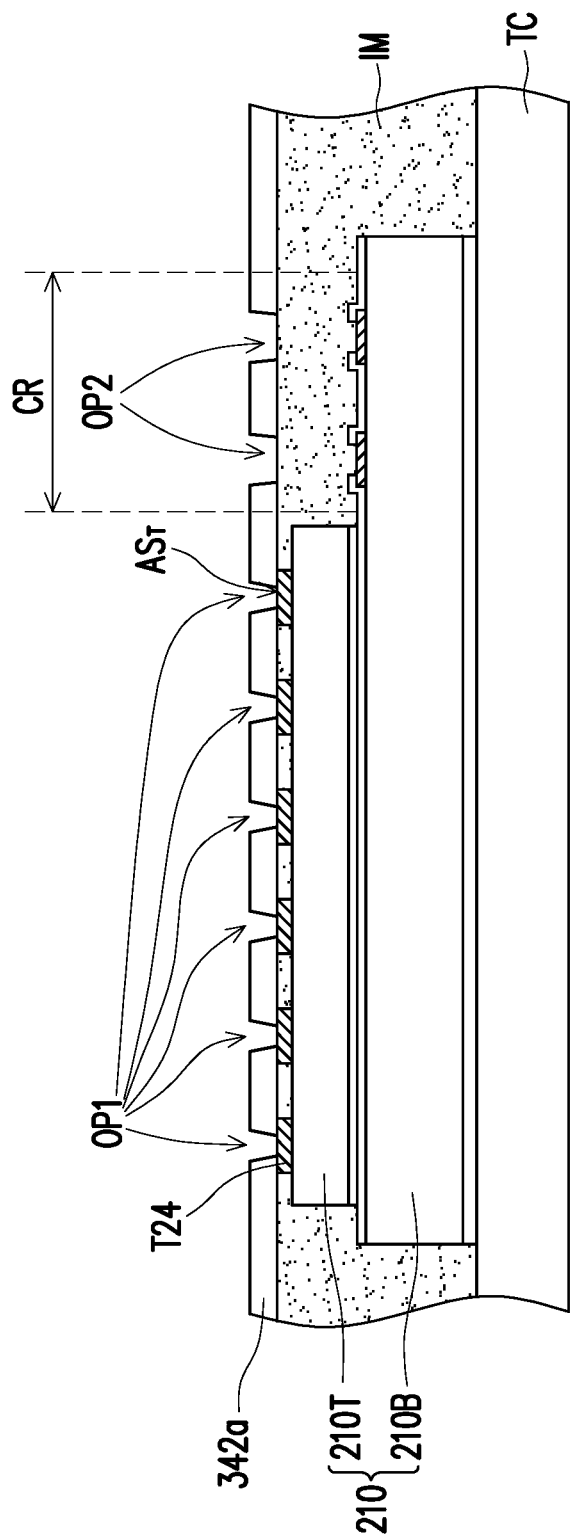
FIG. 11A to FIG. 11E are schematic cross-sectional views of various stages of manufacturing a semiconductor device in accordance with some exemplary embodiments of the disclosure.
Figure 11B:
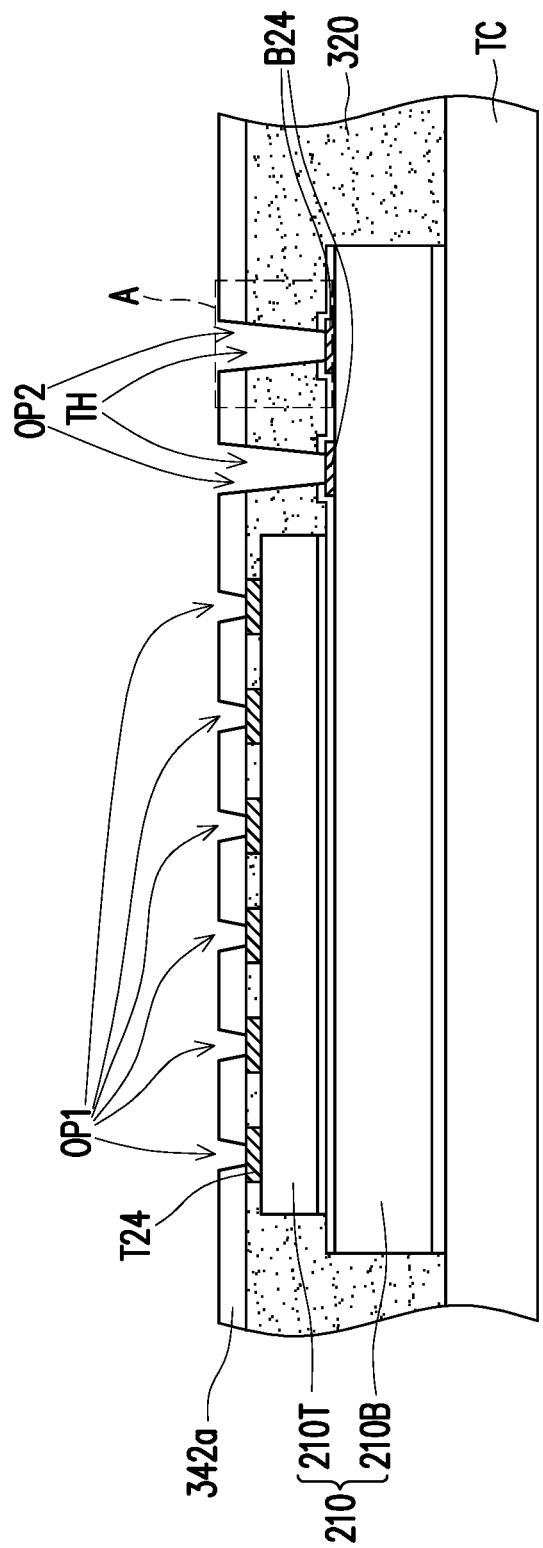

FIG. 11A to FIG. 11E are schematic cross-sectional views of various stages of manufacturing a semiconductor device in accordance with some exemplary embodiments of the disclosure, and FIG. 12A and FIG. 12B are schematic enlarged cross-sectional views illustrating a surface planarization process of the dashed region A depicted in FIG. 11B in accordance with some exemplary embodiments of the disclosure. Referring to FIG. 11A, the die stack 210 including the bottom semiconductor die 210B and the top semiconductor die 210T is disposed on the temporary carrier TC, and an insulating material IM is formed on the temporary carrier TC to encapsulate the die stack 210. In some embodiments, the insulating material IM includes a base material BM (e.g., a polymer, a resin, an epoxy, or the like) and a plurality of filler particles (e.g., dielectric particles of $SiO_2$, $Al_2O_3$, silica, or the like) FP distributed in the base material BM as shown in the enlarged cross-sectional view of FIG. 12A. The insulating material IM may include a molding compound (e.g., epoxy resins), a molding underfill, a dielectric material, or other suitable electrically insulating materials. The insulating material IM may be thinned and/or planarized to accessibly reveal the conductive bumps T24 distributed on the active surface $AS_T$ of the top semiconductor die 210T. Subsequently, a patterned dielectric layer 342a is formed on the insulating material IM and the active surface $AS_T$ of the top semiconductor die 210T using such as lithography and etching process, or other suitable techniques. The patterned dielectric layer 342a includes the first openings OP1 and the second openings OP2. For example, the first openings OP1 expose at least a portion of the conductive bumps T24 of the top semiconductor die 210T, and the second openings OP2 expose a predetermined region of the insulating material IM. The predetermined region may correspond to the connecting region CR and correspond to the locations of the underlying conductive pads B24. At this stage, the conductive pads B24 of the bottom semiconductor die 210B are covered by the insulating material IM.

Referring to FIG. 11B, FIG. 12A and FIG. 12B, a portion of the insulating material IM is removed to form the insulating encapsulation 320 with through holes TH. For example, the underlying portion of the insulating material IM corresponding to the second openings OP2 of the patterned dielectric layer 342a is removed to accessibly reveal the conductive pads B24 of the bottom semiconductor die 210B. A laser drilling process or other techniques (e.g., various etching techniques, waterjet drilling, ultrasonic drilling, or the like) may be utilized to form the through holes TH. As shown in FIG. 12A, after removing the portion of the insulating material IM, the profile of the through holes TH may be rougher than that of the second openings OP2 of the patterned dielectric layer 342a due to the filler particles FP of the insulating material IM. Such rougher profile of the insulating encapsulation 320 may lower the adhesion of the subsequently formed conductive connectors. A surface treatment process or a surface planarization process (e.g., plasma etching, chemical mechanical polishing, or the like) is optionally performed to the inner sidewalls of the insulating encapsulation 320 to flatten the inner sidewall surface of the insulating encapsulation 320 inside the through holes TH. Thus, smoother inner sidewall surface of the insulating encapsulation 320 may be provided since the discontinuity in the inner sidewall surface caused by the filler particles FP has been suppressed. In other words, the inner sidewalls of the insulating encapsulation 320 corresponding to the through holes TH may be substantially smooth, thereby improving the reliability of the subsequently formed conductive connectors. As shown in FIG. 12B, after performing the surface planarization process, the outermost filler particles FP on the inner sidewall surfaces may be partially trimmed to form partial particles FP' distributed on the inner sidewall surface, and hence will have substantially planar inner sidewalls SW' of the insulating encapsulation 320.

Figure 11C:
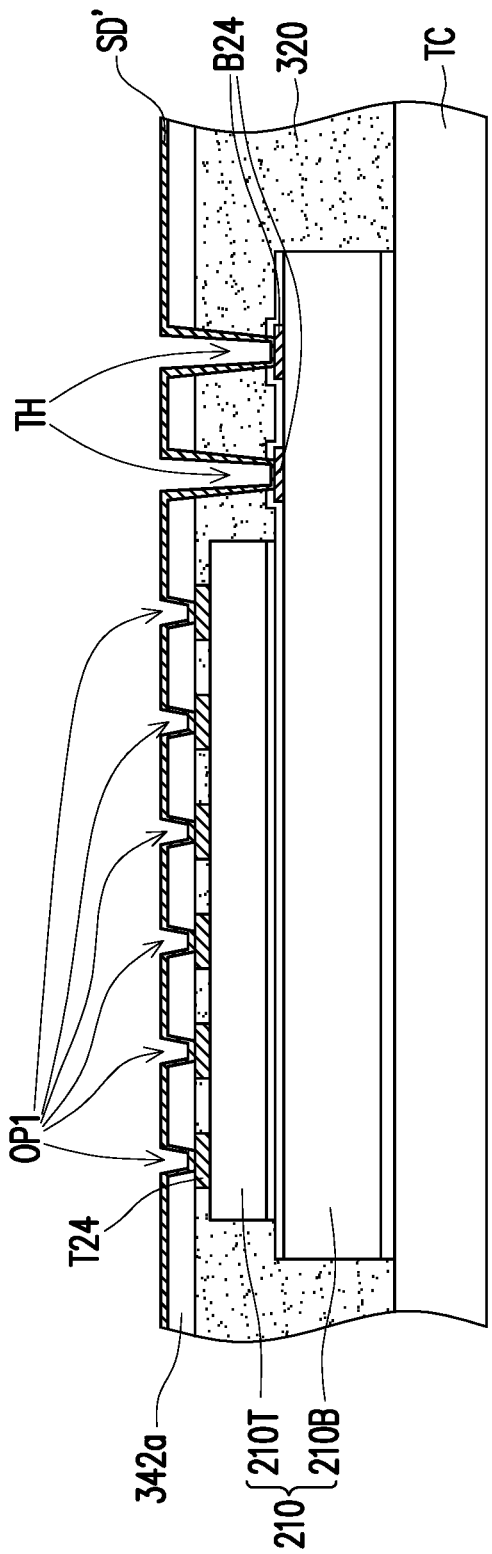

Referring to FIG. 11C, after exposing the conductive bumps T24 of the top semiconductor die 210T and the conductive pads B24 of the bottom semiconductor die 210B, a seed layer SD' may be formed on the patterned dielectric layer 342a and the inner sidewalls of the insulating encapsulation 320 corresponding to the through holes TH. In some embodiments, since the inner sidewalls of the insulating encapsulation 320 in the through holes TH has been planarized prior to the process of forming the seed layer SD', the smooth inner sidewall surfaces of the insulating encapsulation 320 facilitates the deposition of the seed layer SD'. The seed layer SD' may also be formed in the first openings OP1 of the patterned dielectric layer 342a so as to be in electrical and physical contact with the conductive bumps T24 of the top semiconductor die 210T, and formed inside the through holes TH of the insulating encapsulation 320 so as to be in electrical and physical contact with the conductive pads B24 of the bottom semiconductor die 210B. The material and the forming process of the seed layer SD' may be similar to that of the seed layer SD described in FIG. 5D, and the detailed descriptions are omitted for brevity.

Figure 11D:
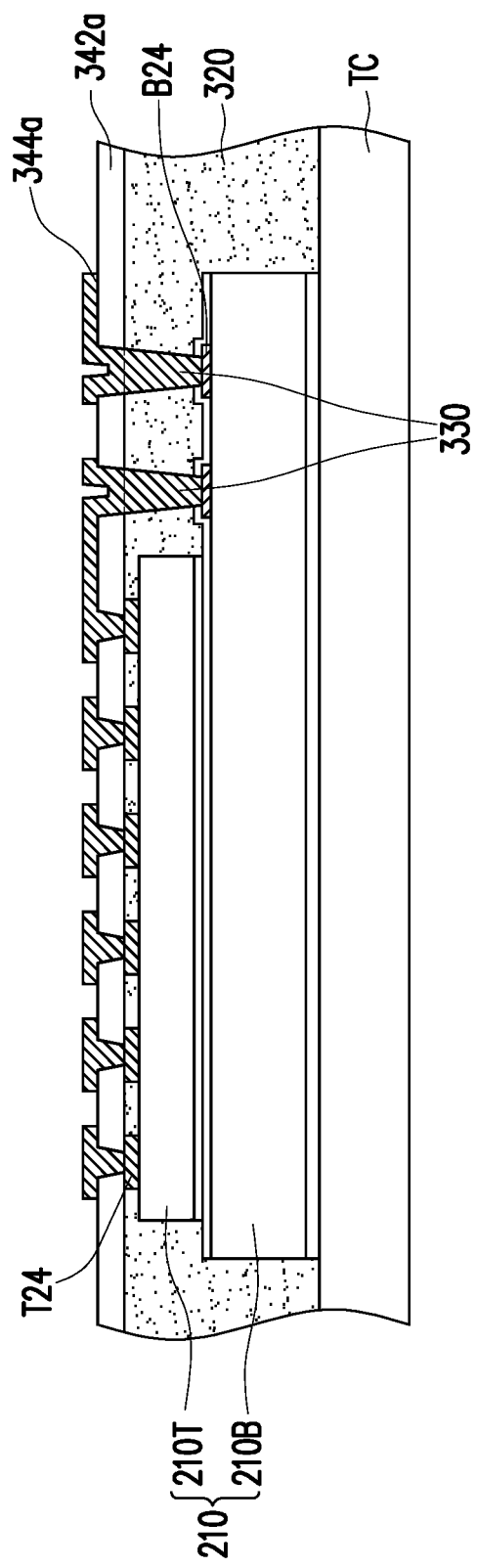

Referring to FIG. 11D, a patterned conductive layer 344a and conductive connectors 330 are formed, the forming processes thereof are similar to the processes described in FIG. 5E and FIG. 5F, so the detailed descriptions are simplified for brevity. For example, after forming the seed layer SD', the sacrificial layer (e.g., photoresist) having openings exposing the intended locations is formed on the seed layer SD', and then the conductive material layer is formed on the seed layer SD' and inside the openings of the sacrificial layer. Subsequently, the sacrificial layer may be stripped, and then a portion of the seed layer SD' without the conductive material layer formed thereon may be etched. Thus, the seed layer SD' and the overlying conductive material layer remained on the patterned dielectric layer 342a may be viewed as the patterned conductive layer 344a. It should be noted that for ease of illustration in the drawings, the seed layer SD' and the overlying conductive material layer are shown in combination as one layer. The portion of the seed layer SD' and the conductive material layer formed inside the through holes TH of the insulating encapsulation 320 may be viewed as the conductive connectors 330. The conductive connectors 330 are laterally in physical contact with the insulating encapsulation 320, and longitudinally in physical contact with the patterned conductive layer 344a and the conductive pads B24 of the bottom semiconductor die 210B.

Figure 11E:
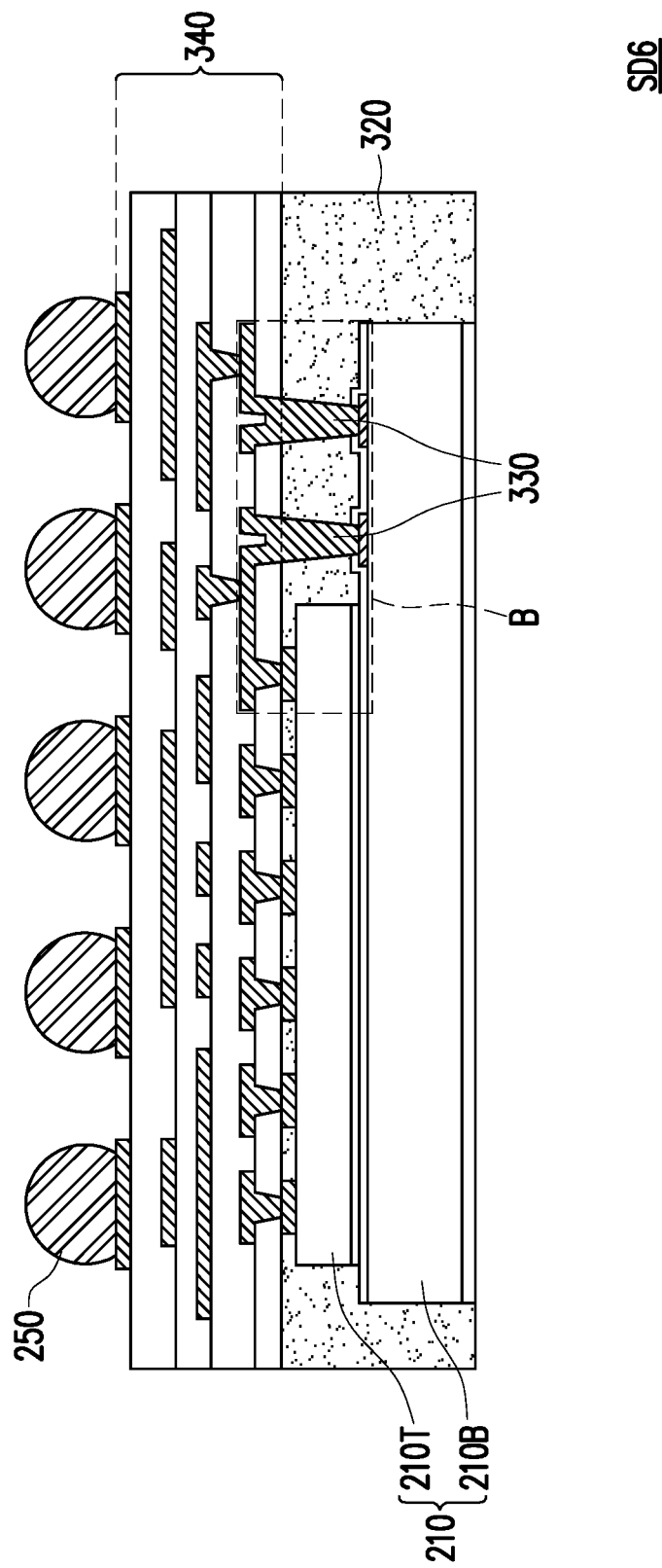

Referring to FIG. 11E, a plurality of patterned dielectric layers (e.g., including 342a) and a plurality of patterned conductive layers (e.g., including 344a) may be stacked alternatively to form a redistribution structure 340, and the conductive terminals 250 may be formed on the redistribution structure 340 for further electrical connection. The temporary carrier TC may be detached, and a singulation process is optionally performed to form individual semiconductor devices SD6. The forming processes are similar to the processes described in FIG. 5G and FIG. 5H, so the detailed descriptions are simplified for brevity.

FIG. 13 is a schematic enlarged cross-sectional view illustrating the dashed region B depicted in FIG. 11E in accordance with some exemplary embodiments of the disclosure, and FIG. 14 is another schematic enlarged cross-sectional view illustrating the dashed region B depicted in FIG. 11E in accordance with some exemplary embodiments of the disclosure. Referring to FIG. 13, FIG. 14, and FIG. 11E, in some embodiments, a pitch P (e.g., center-to-center spacing) of the adjacent conductive pads B24 may range between about 30 µm to about 300 µm. For example, one of the conductive pads B24 may have a pad size (e.g., diameter) Da in a range from about 20 µm to about 250 µm. The passivation layer B26 has the contact openings revealing the underlying conductive pads B24. For example, the circumferences of the conductive pads B24 are covered by the passivation layer B26. Thus, the pad size Da of one of the conductive pads B24 may be greater than the corresponding opening size Db of the contact openings of the passivation layer B26. In some embodiments, one of the contact openings of the passivation layer B26 has an opening size (e.g., diameter) Db in a range from about 20 µm to about 200 µm. It should be noted that the pitch P, the pad size Da, and the opening size Db may vary with device size or may scale with semiconductor processes.

In some embodiments, the heights H of the conductive connectors 330 depend on the thickness of the top semiconductor die 210T and/or the device size. For example, the height H of one of the conductive connectors 330 may range between about 50 µm to about 500 µm. Each conductive connector 330 formed in the through holes TH of the insulating encapsulation 320 may have a top critical dimension $CD_T$ facing toward the redistribution structure 340, and a bottom critical dimension $CD_B$ facing toward the conductive pads B24. The top critical dimension $CD_T$ of one of the conductive connectors 330 may be greater than the bottom critical dimension $CD_B$ of the corresponding one of the conductive connectors 330. The top critical dimension $CD_T$ may range between about 15 µm to about 200 µm, and the bottom critical dimension $CD_B$ may range between about 5 µm to about 100 µm. In some embodiments, the bottom critical dimension $CD_B$ is smaller than the corresponding opening size Db of the passivation layer B26 so that the conductive connectors 330 are not in physical contact with the passivation layer B26 as shown in FIG. 13. In some other embodiments, the bottom critical dimension $CD_B$ is substantially equal to the corresponding opening size Db of the passivation layer B26. The bottoms of the conductive connectors 330 may be wide enough so that the bottoms of the conductive connectors 330 are disposed on of the passivation layer B26 (e.g., on the portion of the passivation layer B26 which covers the circumferences of the conductive pads B24) as shown in FIG. 14.

Figure 15A:
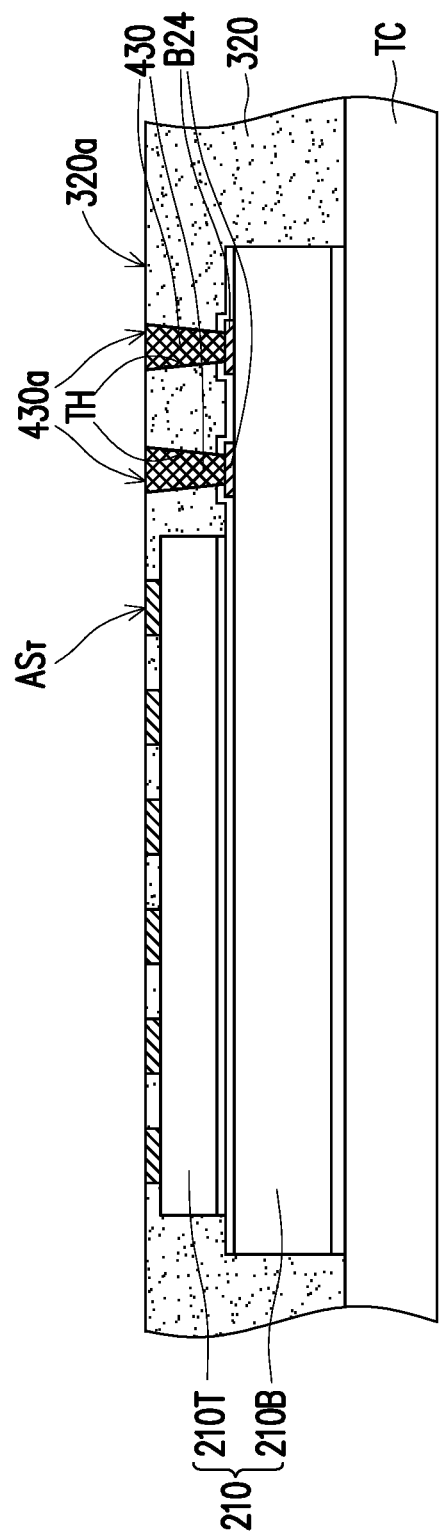
FIG. 15A to FIG. 15C are schematic cross-sectional views of various stages of manufacturing a semiconductor device in accordance with some exemplary embodiments of the disclosure.
Figure 15B:
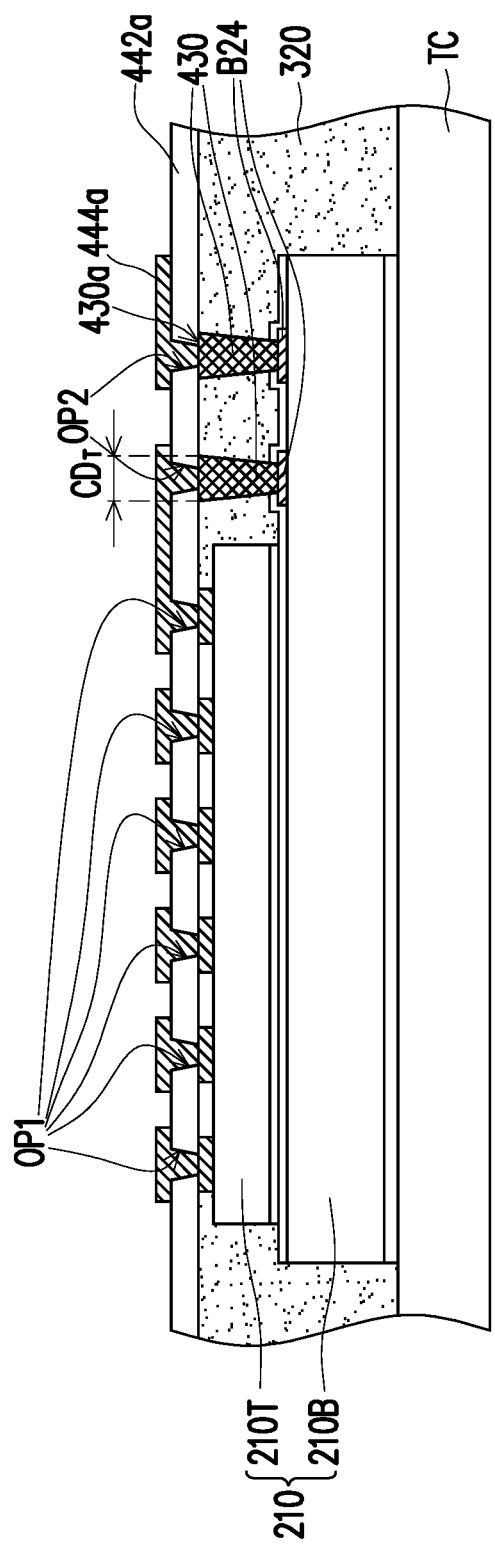
Figure 15C:
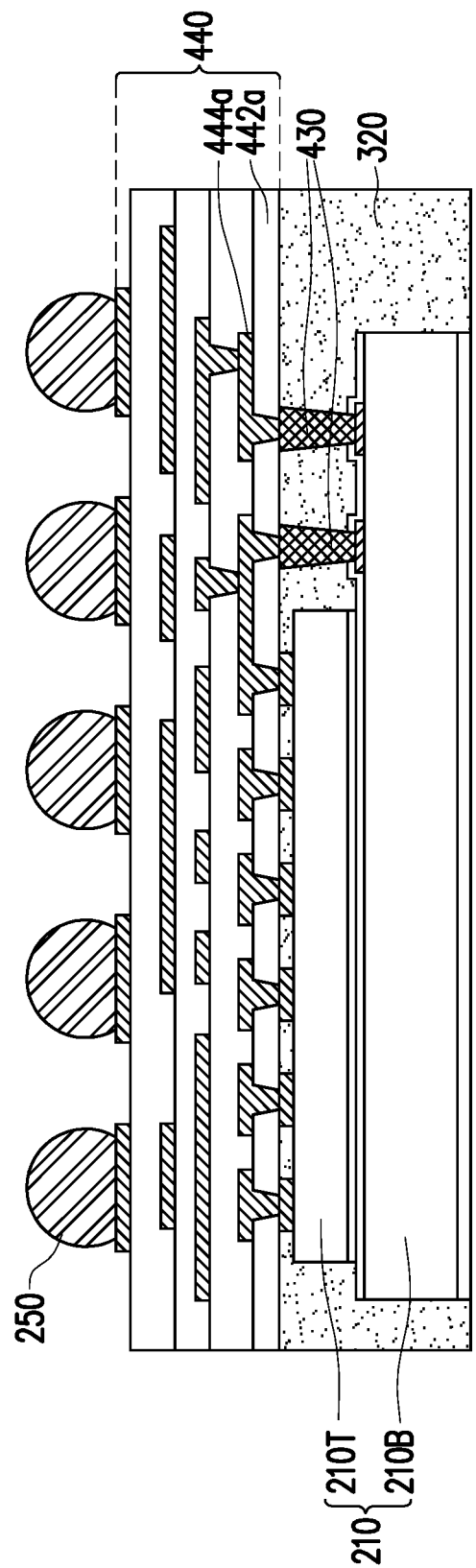

FIG. 15A to FIG. 15C are schematic cross-sectional views of various stages of manufacturing a semiconductor device in accordance with some exemplary embodiments of the disclosure. Referring to FIG. 15A, the die stack 210 including the bottom semiconductor die 210B and the top semiconductor die 210T is disposed on the temporary carrier TC, and the insulating encapsulation 320 having the through holes TH is formed on the temporary carrier TC to laterally encapsulate the die stack 210. The conductive connectors 430 are filled in the through holes TH of the insulating encapsulation 320 to be in physical and electrical contact with the conductive pads B24 of the bottom semiconductor die 210B. For example, the conductive connectors 430 are made of a conductive paste (e.g., copper paste, silver paste, or the like) using a printing process, such as a screen printing process, a stencil printing process, or the like. Thus, no seed layer (e.g., Ti/Cu layer) is formed between the insulating encapsulation 320 and the conductive connectors 430. For example, a patterned mask having apertures (e.g., stencil or screen; not shown) is placed over the insulating encapsulation 320. The apertures of the patterned mask may be aligned with the through holes TH of the insulating encapsulation 320, and then the conductive paste is applied in the through holes TH through the apertures of the patterned mask. In some embodiments, a curing process is performed to cure the applied conductive paste to form the conductive connectors 430. Afterwards, a planarization process is optionally performed so that the active surface $AS_T$ of the top semiconductor die 210T, the top surface 320a of the insulating encapsulation 320, and the top surfaces 430a of the conductive connectors 430 may be substantially coplanar.

Referring to FIG. 15B, after filling the conductive paste in the through holes TH to form the conductive connectors 430, a patterned dielectric layer 442a is formed on the active surface $AS_T$ of the top semiconductor die 210T, the top surface 320a of the insulating encapsulation 320, and the top surfaces 430a of the conductive connectors 430. The patterned dielectric layer 442a may have the first openings OP1 exposing at least a portion of the conductive bumps T24 of the top semiconductor die 210T, and the second openings OP2 exposing at least a portion of the conductive connectors 430. A patterned conductive layer 444a is formed on the patterned dielectric layer 442a, and also formed inside the first openings OP1 and the second openings OP2 so as to be in physical and electrical contact with the conductive bumps T24 and the conductive connectors 430. In some embodiments, a material of the patterned conductive layer 444a is different from that of the conductive connector 430. For example, the patterned conductive layer 444a is formed by sputtering and/or plating copper, and thus the copper density of the patterned conductive layer 444a is denser than the copper density of the conductive connectors 430 made of the copper paste.

In some embodiments, the opening size of one of the second openings OP2 is smaller than the top critical dimension $CD_T$ of one of the conductive connectors 430 such that a portion of the patterned dielectric layer 442a covers the circumferences of the conductive connectors 430. Alternatively, the opening size of one of the second openings OP2 is substantially equal to or greater than the top critical dimension $CD_T$ of one of the conductive connectors 430, which may depends on the parameters of processes. In an exemplary embodiment, the patterned conductive layer 444a may be formed by depositing the seed layer, forming the sacrificial layer on the seed layer, depositing the conductive material layer on the seed layer and inside the openings of the sacrificial layer, removing the sacrificial layer, and etching the unmasked portion of the seed layer, etc. Other suitable patterning and metallization techniques may be used to form the patterned conductive layer 444a.

Referring to FIG. 15C, a plurality of patterned dielectric layers (e.g., including 442a) and a plurality of patterned conductive layers (e.g., including 444a) may be stacked alternatively to form a redistribution structure 440. The conductive terminals 250 may be formed on the redistribution structure 440 for further electrical connection. The temporary carrier TC may be detached, and a singulation process is optionally performed to form individual semiconductor devices SD7. The forming processes are similar to the processes described in FIG. 5G and FIG. 5H, so the detailed descriptions are simplified for brevity.

Figure 16A:
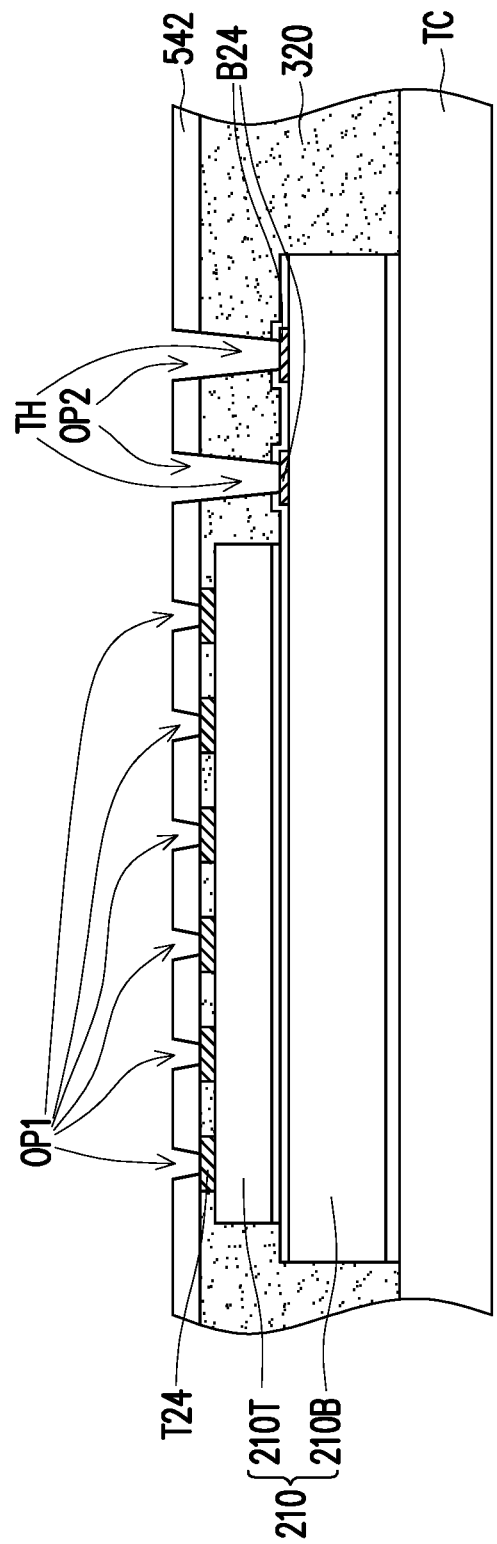
FIG. 16A to FIG. 16C are schematic cross-sectional views of various stages of manufacturing a semiconductor device in accordance with some exemplary embodiments of the disclosure.
Figure 16B:
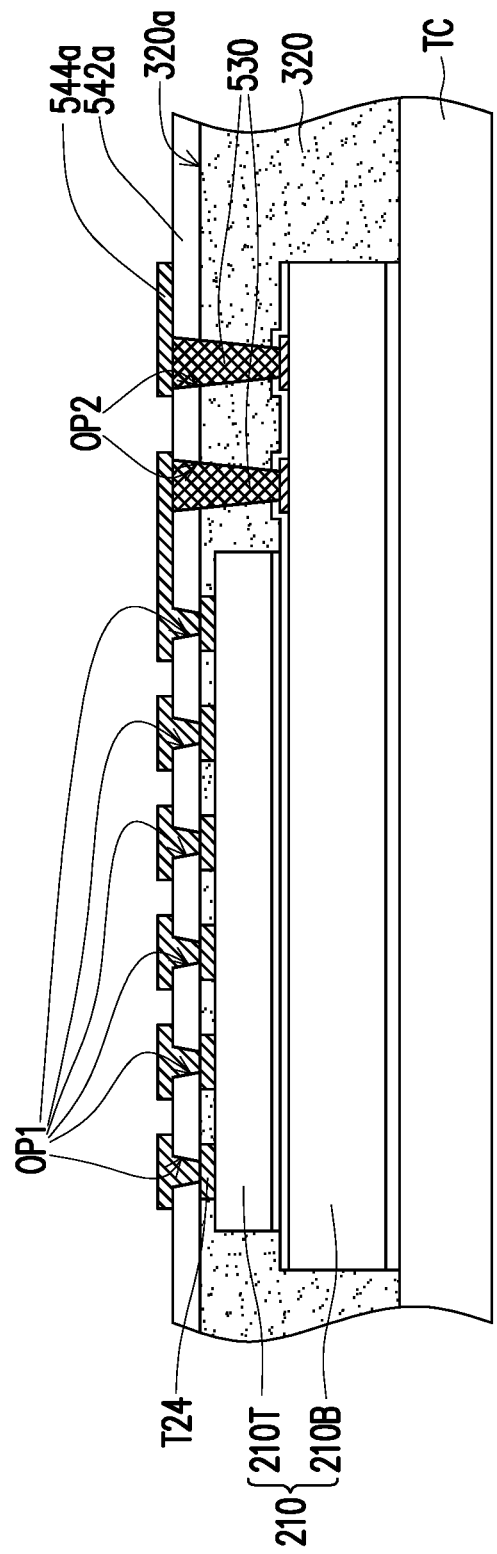
Figure 16C:
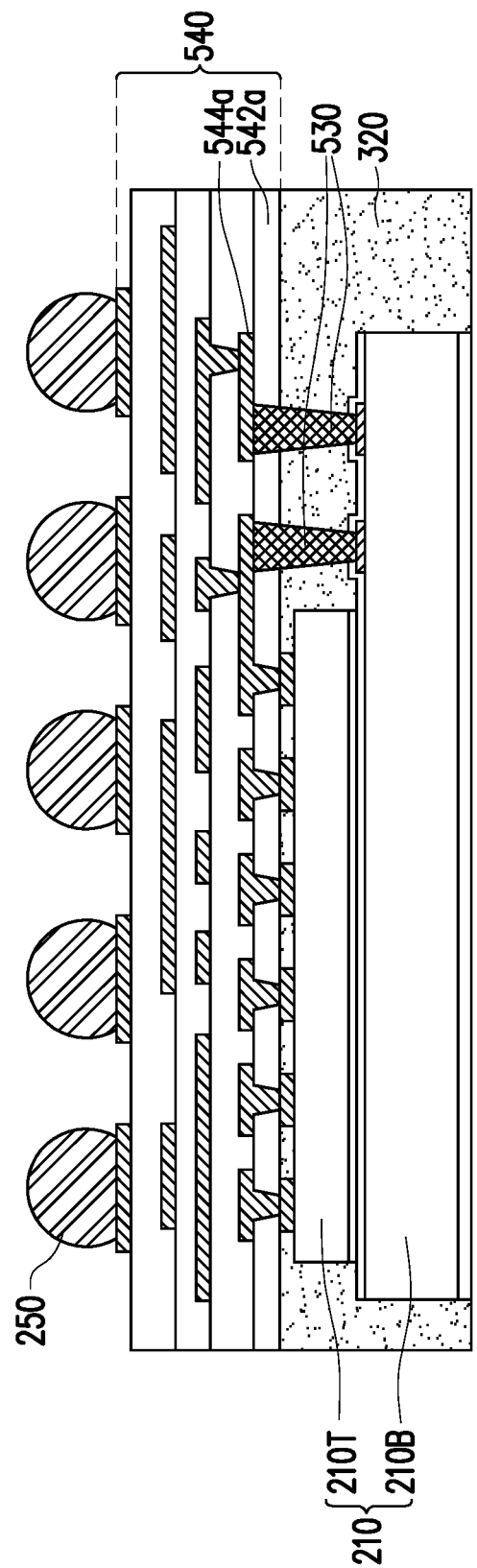

FIG. 16A to FIG. 16C are schematic cross-sectional views of various stages of manufacturing a semiconductor device in accordance with some exemplary embodiments of the disclosure. Referring to FIG. 16A, the die stack 210 including the bottom semiconductor die 210B and the top semiconductor die 210T is disposed on the temporary carrier TC, the insulating encapsulation 320 having the through holes TH exposing the conductive pads B24 is formed on the temporary carrier TC to laterally encapsulate the die stack 210, and the patterned dielectric layer 542a having the first openings OP1 and the second openings OP2 is formed on the insulating encapsulation 320. At least a portion of the conductive bumps T24 of the top semiconductor die 210T is accessibly revealed by the first openings OP1. The second openings OP2 may correspond to the through holes TH of the insulating encapsulation 320. The forming processes may be similar to the forming processes described in FIG. 11A and FIG. 11B, and the detailed descriptions are omitted for brevity. In certain embodiments in which the second openings OP2 of the patterned dielectric layer 542a are formed prior to the through holes TH of the insulating encapsulation 320, the second openings OP2 may serve as alignment marks during the forming process of the through holes TH, so that the conductive pads B24 may be precisely revealed by the through holes TH. Alternatively, the second openings OP2 of the patterned dielectric layer 542a and the through holes TH of the insulating encapsulation 320 may be formed during the same process.

Referring to FIG. 16B, the conductive connectors 530 made of the conductive paste may be formed in the through holes TH of the insulating encapsulation 320. For example, a certain amount of the conductive paste is applied so that the top portion of the conductive connectors 530 may extend beyond the top surface 320a of the insulating encapsulation 320 into the second openings OP2 of the patterned dielectric layer 542a. Thus, the top portion of the conductive connectors 530 extends into the patterned dielectric layer 542a in the thickness direction of the patterned dielectric layer 542a so as to be laterally covered by the patterned dielectric layer 542a. The rest portion of the conductive connectors 530 is laterally covered by the insulating encapsulation 320. After forming the conductive connectors 530, the patterned conductive layer 544a is formed on the surface of the patterned dielectric layer 542a and extends to be in physical and electrical contact with the top portion of the conductive connectors 530. The patterned conductive layer 544a is also formed inside the first openings OP1 to be in contact with the conductive bumps T24 of the top semiconductor die 210T.

Referring to FIG. 16C, a plurality of patterned dielectric layers (e.g., including 542a) and a plurality of patterned conductive layers (e.g., including 544a) may be stacked alternatively to form a redistribution structure 540, and the conductive terminals 250 may be formed on the redistribution structure 540 for further electrical connection. The temporary carrier TC may be detached, and a singulation process is optionally performed to form individual semiconductor devices SD8. The forming processes are similar to the processes described in FIG. 5G and FIG. 5H, so the detailed descriptions are simplified for brevity.

Figure 17:
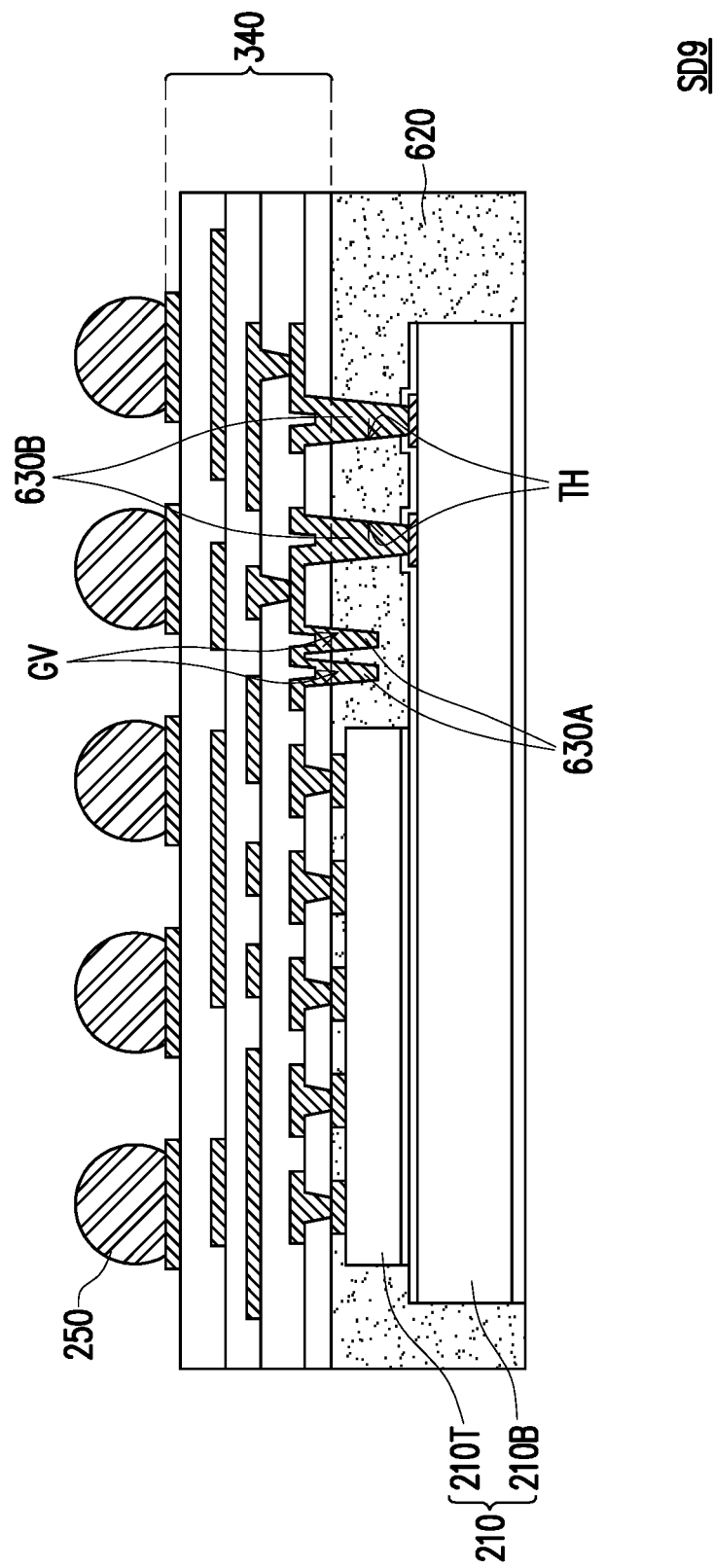
FIG. 17 and FIG. 18 are schematic cross-sectional views of a semiconductor device in accordance with various exemplary embodiments of the disclosure.
Figure 18:
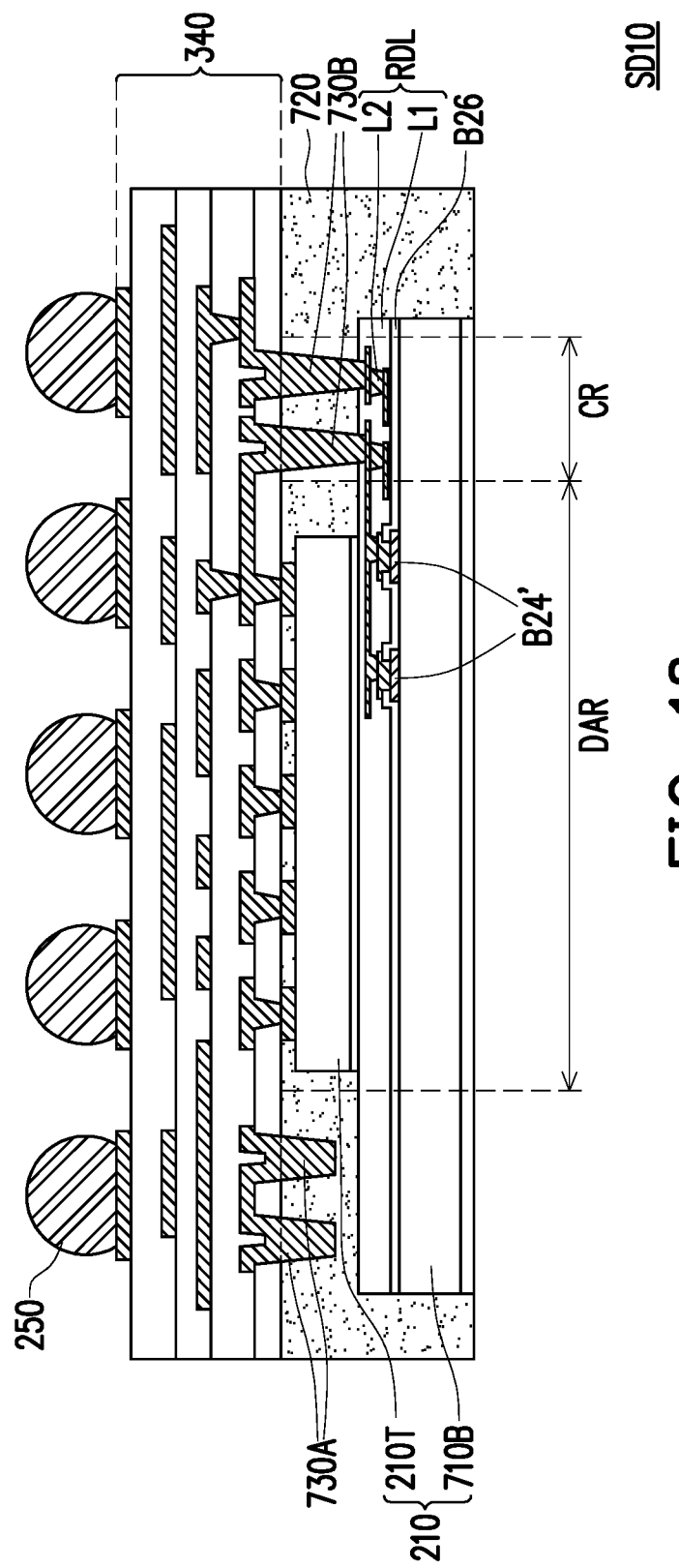

FIG. 17 and FIG. 18 are schematic cross-sectional views of a semiconductor device in accordance with various exemplary embodiments of the disclosure. Referring to FIG. 17, a semiconductor device SD9 is provided. The semiconductor device SD9 includes the die stack 210, the insulating encapsulation 620, a plurality of first conductive connectors 630A, a plurality of second conductive connectors 630B, the redistribution structure 340, and the conductive terminals 250. The die stack 210 includes the top semiconductor die 210T and the bottom semiconductor die 210B. The bottom semiconductor die 210B may be electrically coupled to the top semiconductor die 210T through the redistribution structure 340. The second conductive connectors 630B may be disposed on a periphery of the bottom semiconductor die 210B and aside the top semiconductor die 210T. The first conductive connectors 630A may be disposed right above the bottom semiconductor die 210B, and also disposed between the top semiconductor die 210T and the second conductive connectors 630B. The first conductive connectors 630A and the second conductive connectors 630B may be tapered in a direction from the redistribution structure 340 to the bottom semiconductor die 210B (or in the thickness direction of the insulating encapsulation 620). The insulating encapsulation 620 may laterally encapsulate the die stack 210, the first and second conductive connectors 630A and 630B. The first conductive connectors 630A may be similar to any ones of the conductive connectors described in FIG. 1 through FIG. 4. The second conductive connectors 630B may be similar to any ones of the conductive connectors described in FIG. 5H, FIG. 11E, FIG. 15C, and FIG. 16C.

In some embodiments, the redistribution structure 340 is disposed on the top semiconductor die 210T, the insulating encapsulation 620, and the first and second conductive connectors 630A and 630B. The first and second conductive connectors 630A and 630B may have one ends connected to the redistribution structure 340, but only the second conductive connectors 630B have the opposing ends connected to the conductive pads B24 of the bottom semiconductor die 210B. The opposing ends of the first conductive connectors 630A may be embedded in the insulating encapsulation 620. For example, the insulating encapsulation 620 is spatially separated the first conductive connectors 630A from the bottom semiconductor die 210B and the top semiconductor die 210T. The first conductive connectors 630A are electrically coupled to the top semiconductor die 210T through the redistribution structure 340, and the first conductive connectors 630A may be electrically coupled to the bottom semiconductor die 210B through the redistribution structure 340 and the second conductive connectors 630B. The second conductive connectors 630B are directly connected to the bottom semiconductor die 210B, and may be electrically coupled to the top semiconductor die 210T through the redistribution structure 340.

For example, a portion of the insulating material is removed to form the insulating encapsulation 620 with through holes TH and a groove GV for the subsequently formed second conductive connectors 630B and first conductive connectors 630A. The through holes TH and the groove(s) GV of the insulating encapsulation 620 may be formed by a laser drilling process or other suitable techniques which may be similar to the process described in FIG. 11B. The through holes TH penetrate through the insulating encapsulation 620 to expose the underlying conductive pads, whilst the groove(s) GV do not penetrate through the insulating encapsulation 620. In certain embodiments in which the laser drilling is performed, one of the drilling depths of the through holes TH may be greater than the drilling depth(s) of the groove(s) GV. Thus, the conductive materials formed inside the through holes TH of the insulating encapsulation 620 are the second conductive connectors 630B, and the conductive materials formed inside the groove(s) GV of the insulating encapsulation 620 are the first conductive connectors 630A. The forming process of the first conductive connectors 630A and the second conductive connectors 630B may be similar to the process described in FIG. 11C and FIG. 11D. The redistribution structure 340 and the conductive terminals 250 disposed on the redistribution structure 340 are subsequently formed, and the forming process thereof may be similar to the process described in FIG. 11E, so the detailed descriptions are omitted for brevity.

Referring to FIG. 18, a semiconductor device SD10 is provided. The semiconductor device SD10 includes the die stack 710, the insulating encapsulation 720, a plurality of first conductive connectors 730A, a plurality of second conductive connectors 730B, the redistribution structure 340, and the conductive terminals 250. The die stack 710 includes the bottom semiconductor die 710B and the top semiconductor die 210T stacked thereon. The conductive pads B24' of the bottom semiconductor die 710B may be distributed within the inboard area of the bottom semiconductor die 710B. For example, the die attaching region DAR of the bottom semiconductor die 210B is located between the connecting regions CR, and the conductive pads B24' of the bottom semiconductor die 710B are disposed on the die attaching region DAR. Thus, after disposing the top semiconductor die 210T on the bottom semiconductor die 710B, the conductive pads B24' may be covered by the top semiconductor die 210T. In such embodiments, a redistribution layer RDL including a redistribution circuitry L2 and a dielectric layer L1 is formed on the passivation layer B26. The redistribution circuitry L2 may extend from the die attaching region DAR to at least one of the connecting regions CR. The redistribution circuitry L2 may reroute the signals of the bottom semiconductor die 710B from the conductive pads B24'. For example, the redistribution circuitry L2 is embedded in the dielectric layer L1, and may be in physical and electrical contact with the second conductive connectors 730B and the conductive pads B24' of the bottom semiconductor die 710B. In some embodiments, the second conductive connectors 730B are in physical and electrical contact with the redistribution circuitry L2 within at least one of the connecting regions CR.

The top semiconductor die 210T is disposed on the dielectric layer L1 of the redistribution layer RDL. In some embodiments, the top semiconductor die 210T is surrounded by the first conductive connectors 730A and the second conductive connectors 730B. For example, the first conductive connectors 730A are disposed at one side of the top semiconductor die 210T, and the second conductive connectors 730B are disposed at the opposing side of the top semiconductor die 210T. The first conductive connectors 730A may be or may not be in physical and electrical contact with the redistribution circuitry L2 of the redistribution layer RDL. The first conductive connectors 730A may have one ends embedded in the insulating encapsulation 720 as shown in FIG. 18. Alternatively, the first conductive connectors 730A and the second conductive connectors 730B are identical. The redistribution structure 340 may be disposed on the top semiconductor die 210T, the insulating encapsulation 720, and the first and second conductive connectors 730A and 730B. The conductive terminals 250 may be disposed on the redistribution structure 340 for further electrical connection.

According to some embodiments, a semiconductor device is provided. The semiconductor device includes a first semiconductor die, at least one first conductive connector disposed beside the first semiconductor die and electrically coupled to the first semiconductor die, an insulating encapsulation laterally encapsulating the first semiconductor die and the at least one first conductive connector, and a redistribution structure disposed on the insulating encapsulation and being in contact with the first semiconductor die and the at least one first conductive connector. A thickness of the at least one first conductive connector is less than a thickness of the insulating encapsulation.

According to some embodiments, a semiconductor device is provided. The semiconductor device includes a die stack including a first semiconductor die and a second semiconductor die stacked upon one another, a conductive connector disposed on the second semiconductor die of the die stack and aside the first semiconductor die, an insulating encapsulation encapsulating the die stack and the conductive connector, and a redistribution structure disposed on the insulating encapsulation, the conductive connector, and the first semiconductor die of the die stack. The second semiconductor die includes a die attaching region and a connecting region connected to the die attaching region, and the first semiconductor die is disposed on the die attaching region and the conductive connector is disposed within the connecting region. The conductive connector is in contact with the second semiconductor die of the die stack and the redistribution structure.

According to some embodiments, a manufacturing method of a semiconductor device includes at least the following steps. A rear surface of a top semiconductor die is bonded to a front surface of the bottom semiconductor die to form a die stack, where the bottom semiconductor die comprises a conductive pad unmasked by the top semiconductor die, and the top semiconductor die comprises a conductive bump opposite to the rear surface. An insulating encapsulation is formed to encapsulate the die stack, where the insulating encapsulation comprises a through hole exposing at least a portion of the conductive pad of the bottom semiconductor die, and at least a portion of the conductive bump of the top semiconductor die is accessibly revealed by the insulating encapsulation. A conductive connector is formed in the through hole of the insulating encapsulation to be in contact with the portion of the conductive pad of the bottom semiconductor die. A redistribution structure is formed on the insulating encapsulation, the portion of the conductive bump of the top semiconductor die, and the conductive connector, so that the bottom semiconductor die is electrically connected to the top semiconductor die through the redistribution structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor device, comprising:
   a first semiconductor die;
   at least one first conductive connector, disposed beside the first semiconductor die and electrically coupled to the first semiconductor die;
   an insulating encapsulation, laterally encapsulating the first semiconductor die and the at least one first conductive connector, wherein a thickness of the at least one first conductive connector is less than a thickness of the insulating encapsulation, and an end surface of the at least one first conductive connector opposite to the redistribution structure is in phsyical contact with the insulating encapsulation; and
   a redistribution structure, disposed on the insulating encapsulation and being in contact with the first semiconductor die and the at least one first conductive connector.

2. The semiconductor device as claimed in claim 1, wherein the at least one first conductive connector is tapered in a thickness direction of the insulating encapsulation from the redistribution structure.

3. The semiconductor device as claimed in claim 1, wherein at least one first conductive connector comprises a plurality of the first conductive connectors, and one of the first conductive connectors disposed away from the first semiconductor die has a size greater than a size of another one of the first conductive connectors disposed adjacent to the first semiconductor die.

4. The semiconductor device as claimed in claim 1, further comprising:
   a second semiconductor die, disposed on the first semiconductor die opposite to the redistribution structure, encapsulated by the insulating encapsulation, and electrically coupled to the first semiconductor die through the redistribution structure.

5. The semiconductor device as claimed in claim 4, further comprising:
   a second conductive connector, disposed on a periphery of the second semiconductor die and aside the first semiconductor die, being in contact with the second semiconductor die and the redistribution structure, and laterally covered by the insulating encapsulation.

6. The semiconductor device as claimed in claim 5, wherein the second conductive connector is tapered from the redistribution structure to the second semiconductor die.

7. The semiconductor device as claimed in claim 5, wherein the redistribution structure comprises a patterned dielectric layer, a portion of the patterned dielectric layer extending into the insulating encapsulation is interposed between the second conductive connector and the insulating encapsulation.

8. A semiconductor device, comprising:
a die stack, comprising a first semiconductor die and a second semiconductor die stacked upon one another, wherein the second semiconductor die comprises a die attaching region and a connecting region connected to the die attaching region, and the first semiconductor die is disposed on the die attaching region;
a conductive connector, disposed on the second semiconductor die of the die stack within the connecting region and aside the first semiconductor die;
an insulating encapsulation, encapsulating the die stack and the conductive connector; and
a redistribution structure, disposed on the insulating encapsulation, the conductive connector, and the first semiconductor die of the die stack, wherein the conductive connector is in contact with the second semiconductor die of the die stack and the redistribution structure, and a portion of the conductive connector extends into a patterned dielectric layer of the redistribution structure to be in physical contact with a patterned conductive layer of the redistribution structure that is embedded in the patterned dielectric layer.

9. The semiconductor device as claimed in claim 8, wherein the conductive connector is tapered from the redistribution structure to the second semiconductor die.

10. The semiconductor device as claimed in claim 8, wherein the redistribution structure comprises a patterned dielectric layer, and a portion of the patterned dielectric layer extending into the insulating encapsulation is interposed between the insulating encapsulation and the conductive connector.

11. The semiconductor device as claimed in claim 8, wherein a metal density of the patterned conductive layer of the redistribution structure is denser than that of the conductive connector.

12. The semiconductor device as claimed in claim 11, wherein a portion of the patterned dielectric layer of the redistribution structure laterally interposed between the insulating encapsulation and the conductive connector.

13. The semiconductor device as claimed in claim 8, wherein the second semiconductor die further comprises:
a conductive pad, disposed on the die attaching region; and
a redistribution circuitry, disposed on the conductive pad in the die attaching region and extending to the connecting region, wherein the conductive connector is in contact with the redistribution circuitry within the connecting region.

14. A manufacturing method of a semiconductor device, comprising:
bonding a rear surface of a top semiconductor die to a front surface of a bottom semiconductor die to form a die stack, wherein the bottom semiconductor die comprises a conductive pad unmasked by the top semiconductor die, and the top semiconductor die comprises a conductive bump disposed opposite to the rear surface;
forming an insulating encapsulation to encapsulate the die stack, wherein the insulating encapsulation comprises a through hole exposing at least a portion of the conductive pad of the bottom semiconductor die, and at least a portion of the conductive bump of the top semiconductor die is accessibly revealed by the insulating encapsulation;
forming a patterned dielectric layer of a redistribution structure on the insulating encapsulation, wherein a portion of the patterned dielectric layer extends into the through hole;
forming a conductive connector in the through hole of the insulating encapsulation to be in contact with the portion of the conductive pad of the bottom semiconductor die, wherein the portion of the patterned dielectric layer is laterally interposed between the conductive connector and the insulating encapsulation; and
forming a patterned conductive layer of the redistribution structure on the insulating encapsulation, the portion of the conductive bump of the top semiconductor die, and the conductive connector, so that the bottom semiconductor die is electrically coupled to the top semiconductor die through the patterned conductive layer of the redistribution structure and the conductive connector.

15. The manufacturing method according to claim 14, wherein forming the insulating encapsulation comprises:
forming an insulating material to cover the die stack;
thinning the insulating material to accessibly reveal the portion of the conductive bump of the top semiconductor die; and
removing a portion of the insulating material to form the through hole exposing at least the portion of the conductive pad of the bottom semiconductor die, wherein the through hole is tapered in a direction from the top semiconductor die to the bottom semiconductor die.

16. The manufacturing method according to claim 15, wherein when removing the portion of the insulating material, the through hole and a groove are formed, and then the conductive connector is formed in the through hole and another conductive connector is formed in the groove of the insulating encapsulation.

17. The manufacturing method according to claim 14, wherein forming the patterned conductive layer of the redistribution structure and forming the conductive connector comprise:
conformally depositing a seed layer on the patterned dielectric layer of the redistribution structure and to be in contact with the conductive bump of the top semiconductor die and the conductive pad of the bottom semiconductor die; and
forming a conductive material on the seed layer to form the patterned conductive layer and the conductive connector.

18. The manufacturing method according to claim 14, wherein after removing the predetermined region of the insulating material to form the through hole, a surface planarization process is performed on the insulating encapsulation to flatten an inner sidewall surface of the insulating encapsulation inside the through hole.

19. The manufacturing method according to claim 14, wherein forming the patterned dielectric layer of the redistribution structure and forming the conductive connector comprise:
forming a dielectric material on the insulating encapsulation and inside the through hole;
patterning the dielectric material to form the patterned dielectric layer of the redistribution structure, wherein the patterned dielectric layer comprises a first opening exposing at least the portion of the conductive bump of the top semiconductor die, and a second opening exposing at least the portion of the conductive pad of the bottom semiconductor die, and after forming the second opening, a portion of the patterned dielectric layer is remained inside the through hole; and
forming conductive materials in the first opening and the second opening to respectively form a patterned conductive layer and the conductive connector, wherein the portion of the patterned dielectric layer remained in the through hole is interposed between the conductive connector and the insulating encapsulation.

20. The manufacturing method according to claim 14, wherein the conductive connector is formed by printing a conductive paste inside the through hole of the insulating encapsulation.

* * * * *